(12) United States Patent
Kobayashi

(10) Patent No.: US 8,659,364 B2
(45) Date of Patent: Feb. 25, 2014

(54) OSCILLATOR DEVICE WITH CRYSTAL RESONATORS

(71) Applicant: Nihon Dempa Kogyo Co., Ltd., Tokyo (JP)

(72) Inventor: Kaoru Kobayashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/663,482

(22) Filed: Oct. 30, 2012

(65) Prior Publication Data

US 2013/0106522 A1     May 2, 2013

(30) Foreign Application Priority Data

Nov. 2, 2011    (JP) ................................ 2011-241545

(51) Int. Cl.
    *H03B 5/36*          (2006.01)

(52) U.S. Cl.
    USPC ................ 331/158; 331/116 R; 331/116 FE; 331/176; 331/2; 331/46

(58) Field of Classification Search
    USPC ............... 331/158, 116 R, 116 FE, 176, 2, 46
    See application file for complete search history.

(56) References Cited

U.S. PATENT DOCUMENTS

| | | | | |
|---|---|---|---|---|
| 5,214,668 A | * | 5/1993 | Satou et al. | 374/117 |
| 8,536,952 B2 | * | 9/2013 | Akaike et al. | 331/158 |

FOREIGN PATENT DOCUMENTS

| | | |
|---|---|---|
| JP | 2001-292030 | 10/2001 |
| JP | 2006-033195 | 2/2006 |
| JP | 2007-108170 | 4/2007 |
| JP | 2011-188373 | 9/2011 |
| JP | 2011-252932 | 12/2011 |

* cited by examiner

*Primary Examiner* — Arnold Kinkead
(74) *Attorney, Agent, or Firm* — Jianq Chyun IP Office

(57) ABSTRACT

A value corresponding to a difference value between a value corresponding to a difference between f1 and f1r and a value corresponding to a difference between f2 and f2r is treated as an instantaneous temperature, where f1 and f2 denote oscillation outputs of the first and second oscillation circuits, respectively, and f1r and f2r denote oscillation frequencies of the first and second oscillation circuits, respectively, at a reference temperature. A first correction value is obtained using an approximation formula of the frequency correction value of f1 based on the value corresponding to the difference value, and a second correction value for canceling a correction residual error is obtained from the correction residual error which is a difference between the first correction value and the frequency correction value actually measured. The frequency correction value is obtained from a sum of the first and second correction values.

7 Claims, 20 Drawing Sheets

US 8,659,364 B2

OSCILLATOR DEVICE WITH CRYSTAL RESONATORS

CROSS-REFERENCE TO RELATED APPLICATION

This application claims the priority benefit of Japanese application serial no. 2011-241545, filed Nov. 2, 2011. The entirety of the above-mentioned patent application is hereby incorporated by reference herein and made a part of specification.

BACKGROUND OF THE INVENTION

1. Field of the Invention

The present invention relates to an oscillator device that detects a temperature around a crystal unit and performs temperature compensation of an output frequency based on a temperature detection result.

2. Description of Related Art

In a case where a crystal oscillator is combined with applications requiring a significant high frequency stability, an oven controlled crystal oscillator (OCXO) is typically utilized. However, the OCXO has a large scale and a high power consumption. For this reason, a temperature controlled crystal oscillator (TCXO) having a simple structure and a low power consumption has been discussed in the art. However, the TCXO is disadvantageous in that its frequency stability against a temperature is lower than that of the OCXO.

FIG. 20 illustrates a typical structure of the TCXO. In FIG. 20, a crystal unit 90 and an oscillation circuit 91 are illustrated. The capacity of the voltage variable capacity element 92 is controlled by changing the control voltage supplied to a voltage variable capacity element 92 from the control voltage generator unit 93 to adjust the oscillation frequency (output frequency).

Since a frequency of the crystal unit 90 is changed depending on a temperature, the control voltage generator unit 93 corrects the control voltage depending on the temperature detected by the temperature detector 94. Specifically, a function obtained by normalizing a frequency temperature characteristic of the crystal unit 90 using a reference temperature, e.g., a third-order function is stored in a memory 95, and a frequency corresponding to a temperature detection value is read based on this function (frequency temperature characteristic). That is, how much a frequency at that temperature is deviated from the frequency at the reference temperature is read, and a control voltage corresponding to the frequency deviation as a temperature compensation amount is subtracted from the control voltage corresponding to the frequency at the reference temperature.

However, the data amount for specifying the function of the frequency temperature characteristic increases in order to perform accurate temperature correction control, so that a large-capacity memory 95 is necessary, which is expensive. In addition, since a thermistor is typically utilized as the temperature detector, it is difficult to anticipate improvement of the frequency accuracy due to a limitation in the detection accuracy of the temperature detector even when the aforementioned data amount increases.

In addition, the temperature detector 94 and the crystal unit 90 have a different arrangement position, thus it is difficult to obtain accurate temperature information of the crystal unit 90 in practice. At this point, it is also difficult to anticipate improvement of the frequency accuracy.

Referring to FIGS. 2 and 3 of Japanese Unexamined Patent Application No. 2001-292030, there is disclosed a configuration in which two crystal units (crystal resonators) are provided using two pairs of electrodes in a common crystal element. In addition, paragraph [0018] discloses that there is a frequency difference between two crystal units depending on a temperature change, so that it is possible to measure the temperature by measuring this frequency difference. In addition, a relationship between this frequency difference Δf and a frequency correction amount is stored in a read-only memory (ROM), and the frequency correction amount is read based on the frequency difference Δf.

However, in this technique, as disclosed in paragraph [0019], it is necessary to perform adjustment of the crystal units so as to establish a relationship f0≈f1≈f2 between a desired output frequency f0 and frequencies f1 and f2 of each of the two crystal units. Therefore, a manufacturing process of the crystal unit becomes complicated, so that it is difficult to obtain a high product yield. Furthermore, as disclosed in FIG. 4, clocks as a frequency signal from each crystal unit are counted for a predetermined time period, and a difference (f1−f2) therebetween is obtained. Therefore, the detection accuracy directly influences the detection time, so that it is difficult to perform temperature compensation with high accuracy.

SUMMARY OF THE INVENTION

The present invention has been made in view of the aforementioned problems, and an aim thereof is to provide an oscillator device capable of performing temperature compensation of an output frequency with high accuracy.

According to an aspect of the present invention, there is provided an oscillator device for correcting a setting signal for setting an output frequency based on a detection result of an ambient temperature, including a first crystal unit, a second crystal unit, first and second oscillation circuits, a frequency difference detection unit, a first correction value acquisition unit, a second correction value acquisition unit, and a first adder unit. The first crystal unit has a crystal element and a first electrode. The second crystal unit has a crystal element and a second electrode. The first and second oscillation circuits are connected to the first and second crystal units, respectively. The frequency difference detection unit obtains a value corresponding to a difference value between a value corresponding to a difference between f1 and f1r and a value corresponding to a difference between f2 and f2r, where f1 denotes an oscillation frequency of the first oscillation circuit, f1r denotes an oscillation frequency of the first oscillation circuit at a reference temperature, f2 denotes an oscillation frequency of the second oscillation circuit, and f2r denotes an oscillation frequency of the second oscillation circuit at a reference temperature. The first correction value acquisition unit obtains a first correction value based on a first approximation formula expressing a relationship between a value corresponding to the difference value detected by the frequency difference detection unit, a value corresponding to the difference value, and a frequency correction value of the oscillation frequency f1 of the first oscillation circuit caused by a fact that an ambient temperature is different from the reference temperature; a second correction value acquisition unit that obtains a second correction value based on a second approximation formula expressing a relationship between the value corresponding to the difference value, a group of values corresponding to the difference value arranged with a predetermined interval, and correction residual errors obtained in advance for each of the values corresponding to the detection values belonging to the group, where the correction residual error refers to a difference between the first correction value defined in the first approximation formula and the frequency correction value actually measured in advance. The first adder unit obtains the frequency correction value by adding the first and second correction values, wherein an output of the oscillator device is generated by using an output of the first oscillation circuit, and the setting signal is corrected based on the frequency correction value obtained by the first adder unit.

The oscillator device may include that: (a) the first approximation formula is a polynomial approximation based on a least-square method for expressing a relationship between the value corresponding to the difference value and the frequency correction value actually measured; (b) the second approximation formula is a linear interpolation for interpolating correction residual errors obtained for values corresponding to the neighboring difference values belonging to the group; and (c) the first and second correction value acquisition units use $\{(f2-f2r)/f2r\}-\{(f1-f1r)/f1r\}$ as a value corresponding to the difference value between a value corresponding to the difference between f1 and f1r and a value corresponding to the difference between f2 and f2r, (d) the frequency difference detection unit includes a pulse creating unit that creates a pulse of the difference frequency between f1 and f2, a direct digital synthesizer (DDS) circuit unit that outputs a frequency signal having a signal value repeatedly rising and falling with time at a frequency depending on an input DC voltage, a latch circuit that latches the frequency signal output from the DDS circuit unit on the pulse created by the pulse creating unit, a loop filter that integrates the signal value latched by the latch circuit and outputs an integral value as the value corresponding to the difference value, and a second adder unit that obtains a difference between an output of the loop filter and a value corresponding to a difference between f1r and f2r and uses the obtained difference as an input value to the DDS circuit unit; (e) the crystal element of the first crystal unit and the crystal element of the second crystal unit are commonly used; and (f) the first correction value acquisition unit obtains a first correction value based on a first approximation formula expressing a relationship between a value corresponding to the difference value detected by the frequency difference detection unit, a value corresponding to the difference value, and a frequency correction value of an oscillation frequency f0 caused by a fact that an ambient temperature of another oscillation circuit for oscillating another crystal unit different from the first and second crystal units is different from the reference temperature, instead of obtaining the first correction value based on the first approximation formula expressing a relationship between the value corresponding to the difference value detected by the frequency difference detection unit, the value corresponding to the difference value, and the frequency correction value of the oscillation frequency f1 of the first oscillation circuit caused by a fact that an ambient temperature is different from the reference temperature, the second correction value acquisition unit obtains a second correction value based on a second approximation formula expressing a relationship between a value corresponding to the difference value, a group of values corresponding to the difference values arranged with a predetermined interval, and correction residual errors obtained in advance for each of values corresponding to the difference values belonging to the group, where the correction residual error refers to a difference between the first correction value defined in the first approximation formula and a frequency correction value actually measured in advance for the another crystal unit, instead of obtaining the second correction value based on the second approximation formula expressing a relationship between the value corresponding to the difference value, a group of values corresponding to the difference values arranged with a predetermined interval, and correction residual errors obtained in advance for each of values corresponding to the difference values belonging to the group, and the output of the oscillator device is generated by using an output of the another oscillation circuit instead of using the output of the first oscillation circuit.

According to the present invention, in the oscillator device for correcting an output frequency based on a detection result of an ambient temperature, a value corresponding to a difference value between a value corresponding to a difference between f1 and f1r and a value corresponding to a difference between f2 and f1r is treated as an instantaneous temperature, where f1 and f2 denote oscillation outputs of the first and second oscillation circuits, respectively, and f1r and f1r denote oscillation frequencies of the first and second oscillation circuits at the reference temperature, respectively. Therefore, since correlation between this value and the temperature is significantly high, it is possible to perform temperature compensation of the output frequency with high accuracy. In addition, in this case, the first correction value is obtained using an approximation formula (first approximation formula) of the frequency correction value of f1 based on the value corresponding to the difference value, and the second correction value for cancelling a correction residual error is obtained from an approximation formula (second approximation formula) of the correction residual error which is a difference between the first correction value and the frequency correction value actually measured. In addition, the frequency correction value is obtained from a sum of the first and second correction values. Therefore, it is possible to perform temperature compensation with high accuracy by reducing an error caused by a fact that the approximation formula is used to obtain the first correction value.

DESCRIPTION OF THE EMBODIMENTS

Figure 1:
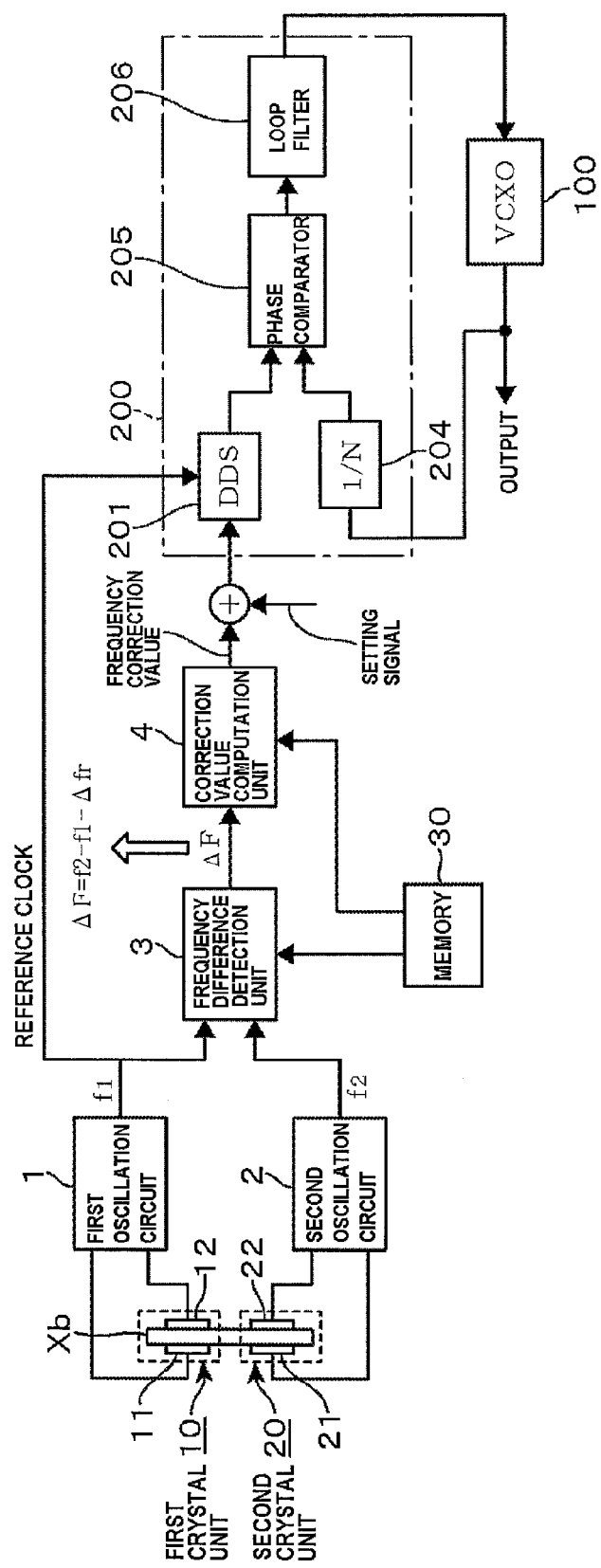
FIG. 1 is a block diagram illustrating a configuration of the entire oscillator device according to an embodiment of the present invention.

FIG. 1 is a block diagram illustrating a configuration of the entire oscillator device according to an embodiment of the present invention. The oscillator device includes: a voltage controlled oscillator 100 that has a crystal unit and serves as a frequency synthesizer for outputting a frequency signal of a predetermined frequency; a control circuit unit 200 that serves as a phase locked loop (PLL) in the voltage controlled oscillator 100; and a temperature compensation unit that performs temperature compensation of the reference clock input to the control circuit unit 200. Although no reference symbol is assigned to the temperature compensation unit, it corresponds to the left side of the control circuit unit 200 in FIG. 1.

In the control circuit unit 200, a phase frequency comparator 205 compares a phase of the reference clock output from the direct digital synthesizer (DDS) circuit unit 201 and a phase of the clock obtained by dividing the output of the voltage controlled oscillator 100 using the divider 204, and a phase difference of the comparison result is converted into an analog signal by a charge pump (not illustrated). The analog signal is input to the loop filter 206 and is controlled so as to stabilize the phase locked loop (PLL). Therefore, the control circuit unit 200 may be referred to as a PLL unit. Here, the DDS circuit unit 201 uses a frequency signal output from the first oscillation circuit 1 described below as a reference clock and receives frequency data (digital value) for outputting a desired frequency signal.

However, since a frequency of the reference clock has a temperature characteristic, a signal corresponding to a frequency correction value described below is added to the frequency data input to the DDS circuit unit 201 in order to cancel the temperature characteristic. By correcting the frequency data input to the DDS circuit unit 201, a temperature fluctuation amount of the output frequency of the DDS circuit unit 201 caused by the temperature characteristic fluctuation of the reference clock is canceled. As a result, the frequency of the reference clock is stabilized for the temperature fluctuation, and the output frequency from the voltage controlled oscillator 100 is stabilized.

The temperature compensation unit includes first and second crystal units 10 and 20. The first and second crystal units 10 and 20 are configured using a common crystal element Xb. That is, for example, a rectangular area of the crystal element Xb is divided by 2 along the longitudinal direction, and front and rear sides of the divided area (vibration area) are provided with excitation electrodes. Therefore, one of the divided areas and a pair of electrodes 11 and 12 constitute the first crystal unit 10, and the other divided area and a pair of electrodes 21 and 22 constitute the second crystal unit 20. For this reason, it can be said that the first and second crystal units 10 and 20 are thermally combined.

The first and second oscillation circuits 1 and 2 are connected to the first and second crystal units 10 and 20, respectively. Either the output of the oscillation circuit 1 or 2 may be, for example, an overtone (harmonics) of the crystal unit 10 or 20 or a fundamental wave. In a case where the overtone output is obtained, for example, an overtone tuner circuit is provided in the oscillation loop including a crystal unit and an amplifier so as to oscillate the oscillation loop using the overtone. Alternatively, the oscillation loop may be oscillated using the fundamental wave, and a class-C amplifier may be provided in a rear stage of the oscillator, for example, in a rear stage of the amplifier as a part of the Colpitt's circuit, so that the fundamental wave is distorted using the class-C amplifier. In addition, a tuner circuit tuned to the overtone may be provided in a rear stage of the class-C amplifier. As a result, both the oscillation circuits 1 and 2 may output, for example, an oscillation frequency of the 3rd-order overtone.

Here, for brevity purposes, assuming that a frequency signal of a frequency f1 is output from the first oscillation circuit 1, and a frequency signal of a frequency f2 is output from the second oscillation circuit 2, the frequency signal of the frequency f1 is supplied to the control circuit unit 200 as a reference clock. The frequency difference detection unit 3 is, schematically speaking, a circuit unit for obtaining a difference between the frequencies f1 and f2 and $\Delta f$ ($\Delta F=f2-f1-\Delta fr$), where $\Delta fr$ denotes a difference between the frequencies f1 and f2 at a reference temperature of, for example, 25° C. The difference between frequencies f1 and f2 may be, for example, several MHz. The present invention is established by computing a difference ΔF between a difference between the frequencies f1 and f2 and a difference between the frequencies f1 and f2 at a reference temperature of, for example, 25° C. using the frequency difference detection unit 3. According to the present embodiment, more specifically, the value output from the frequency difference detection unit 3 is expressed as $\{(f2-f1)/f1\}-\{(f2r-f1r)/f1r\}$. Note that an indication of the output of the frequency difference detection unit 3 is abbreviated in the drawings.

Figure 2:
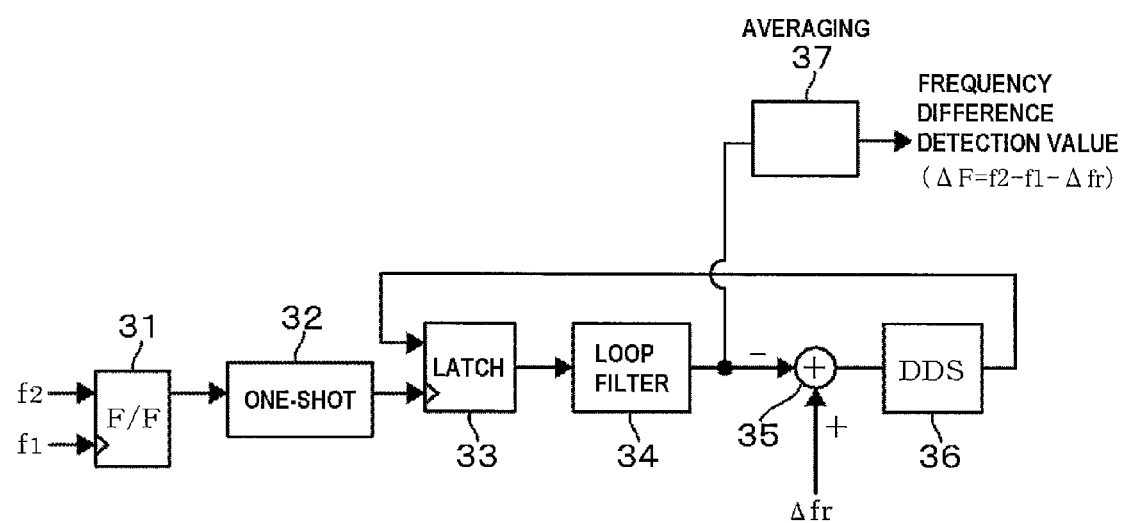
FIG. 2 is a block diagram illustrating a part of the oscillator device according to an embodiment of the present invention.

FIG. 2 illustrates a specific example of the frequency difference detection unit 3. The frequency signal of the frequency f1 is input to one of the input terminals of the flip-flop (F/F) circuit 31 from the first oscillation circuit 1, and the frequency signal of the frequency f2 is input to the other input terminal from the second oscillation circuit 2, so that the frequency signal of the frequency f2 from the second oscillation circuit 2 is latched on the frequency signal of the frequency f1 from the first oscillation circuit 1. In the following description, for brevity purposes, it is assumed that reference symbols f1 and f2 denote frequencies or frequency signals. The flip-flop circuit 31 outputs a signal of a frequency (f2−f1)/f1 corresponding to the frequency difference between the frequencies f1 and f2.

Figure 3:
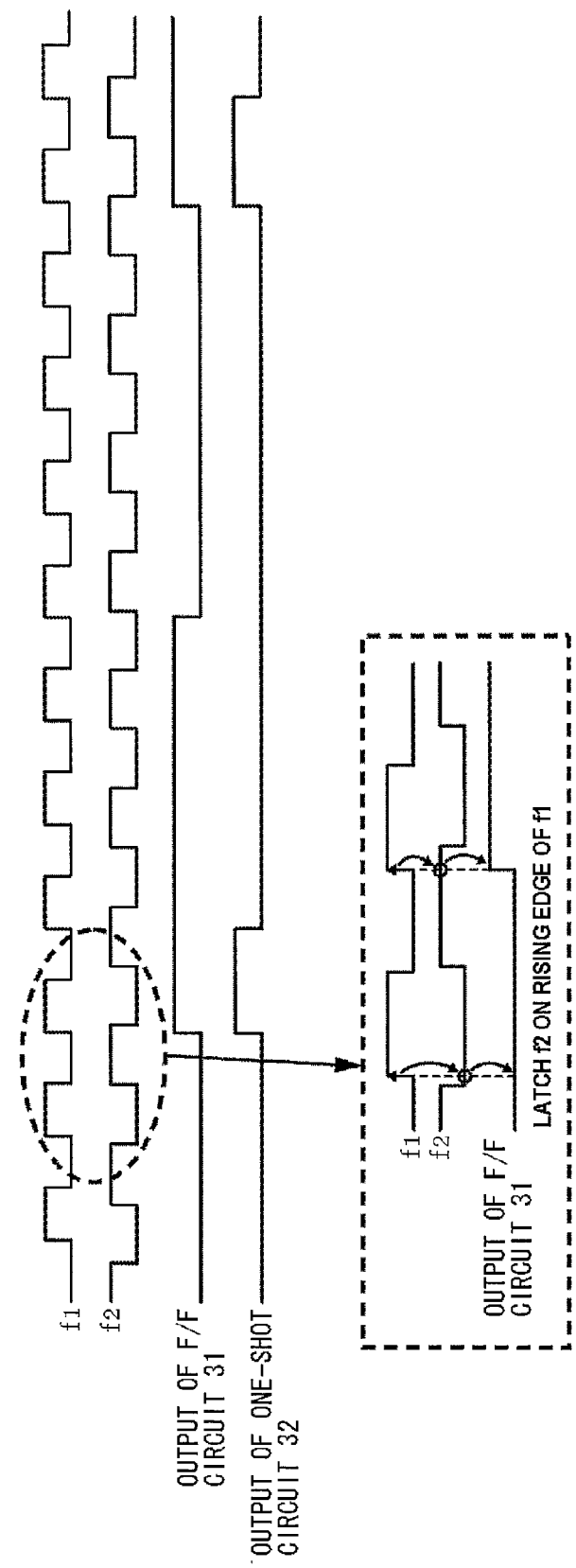
FIG. 3 is a waveform diagram illustrating a part of the output of the oscillator device of FIG. 2.

A one-shot circuit 32 is provided in a rear stage of the flip-flop circuit 31. The one-shot circuit 32 outputs a one-shot pulse at the rising edge of the pulse signal obtained from the flip-flop circuit 31. FIG. 3 is a timing chart illustrating a series of signals described hereinbefore.

A phase locked loop (PLL) is provided in a rear stage of the one-shot circuit 32. The PLL includes a latch circuit 33, a loop filter 34 having an integral function, an adder unit 35, and a DDS circuit unit 36. The latch circuit 33 is used to latch the saw-tooth wave output from the DDS circuit unit 36 on the pulse output from the one-shot circuit 32. The output of the latch circuit 33 has a signal level of the aforementioned saw-tooth wave at the timing that the aforementioned pulse is output. The loop filter 34 integrates the DC voltage of this signal level, and the adder unit 35 adds this DC voltage and the DC voltage corresponding to the difference Δfr. The data corresponding to the DC voltage corresponding to Δfr are stored in the memory 30 of FIG. 1.

In this example, in the adder unit 35, the DC voltage corresponding to Δfr has a positive sign (+) in the input side, and the output voltage of the loop filter 34 has a negative sign (−) in the input side. The DDS circuit unit 36 receives a voltage obtained by subtracting the output voltage of the loop filter 34 from the DC voltage operated by the adder unit 35, that is, the DC voltage corresponding to Δfr and outputs a saw-tooth wave having a frequency corresponding to this voltage. In order to facilitate understanding of the PLL operation, the output of each unit is illustrated very schematically in FIG. 4. At the time of starting up, the DC voltage corresponding to Δfr is input to the DDS circuit unit 36 through the adder unit 35. For example, if Δfr is set to 5 MHz, the saw-tooth wave having a frequency corresponding to this frequency is output from the DDS circuit unit 36.

Figure 4:
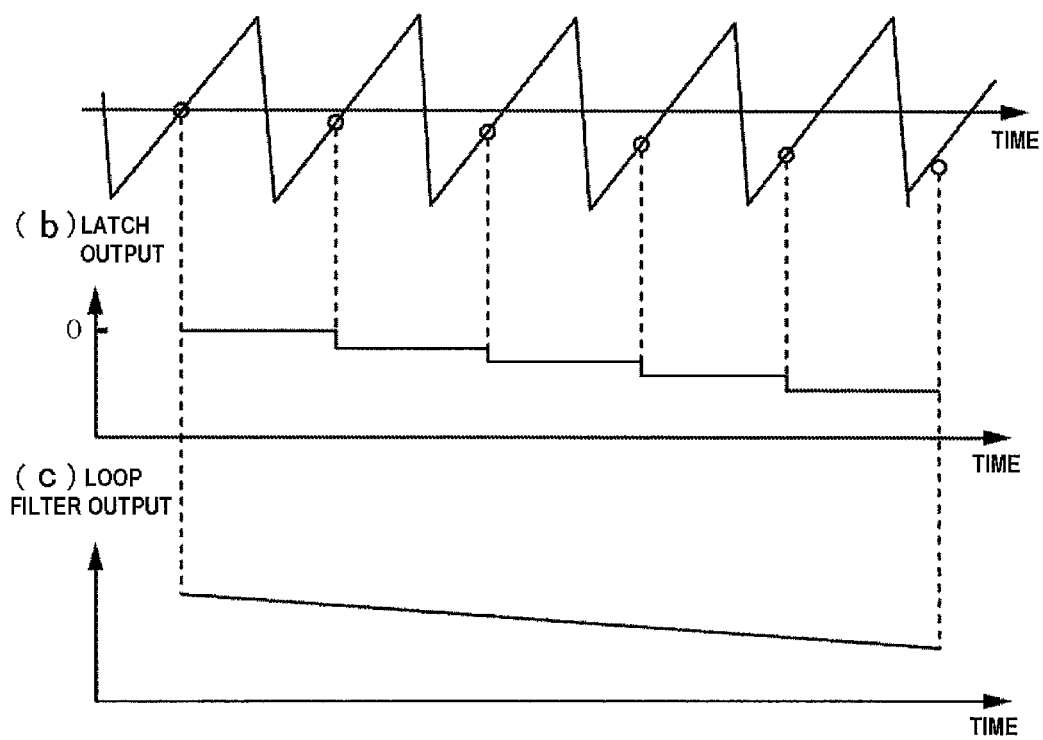
FIG. 4 includes part (a), part (b) and part (c), and schematically illustrates states at each unit while a loop including the DDS circuit unit of FIG. 2 is not locked.
Figure 5:
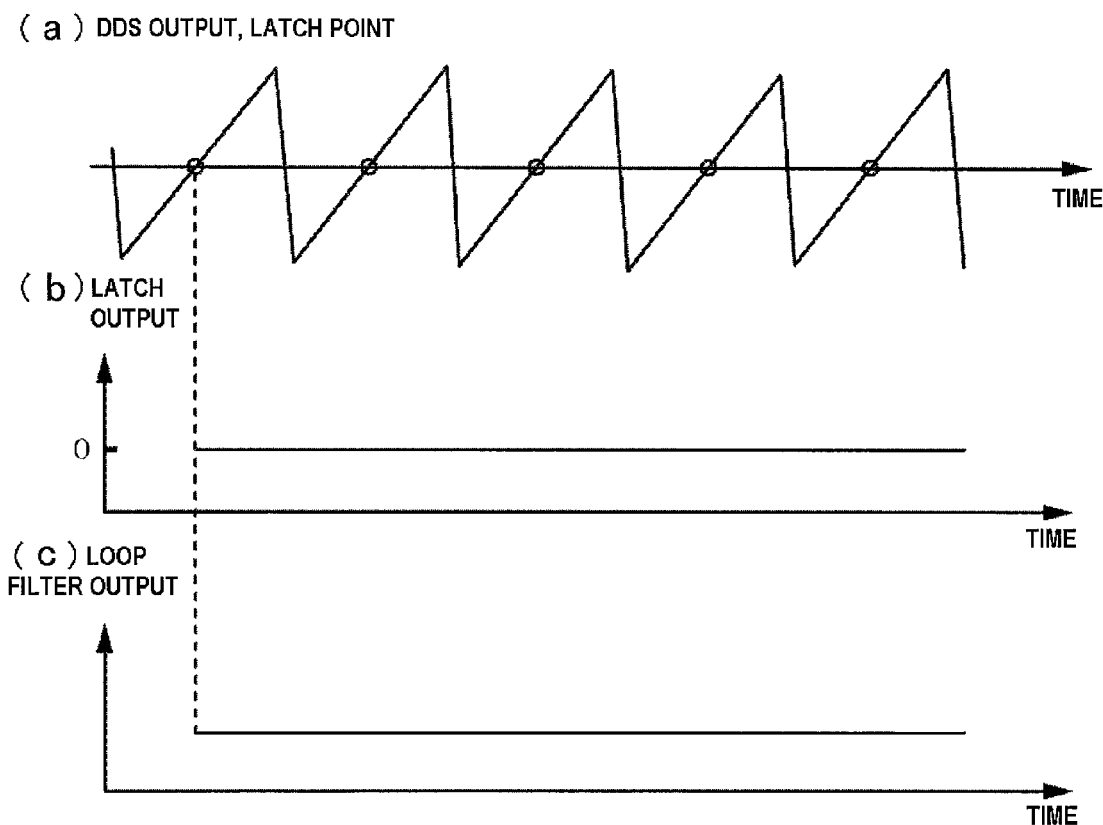
FIG. 5 includes part (a), part (b) and part (c), and schematically illustrates states at each unit while the loop including the DDS circuit unit of FIG. 2 is locked.

Although the saw-tooth wave is latched by the latch circuit 33 on the pulse having a frequency corresponding to (f2−f1), if (f2−f1) is, for example, 6 MHz, the latch point of the saw-tooth wave gradually falls down as illustrated in part (a) of FIG. 4 because the latch pulse has a period shorter than that of the saw-tooth wave, so that the output of the latch circuit 33 and the output of the loop filter 34 fall down to the negative (−) side as illustrated in part (b) and part (c) of FIG. 4. Since the loop filter 34 of the adder unit 35 has a negative sign (−) in the output side, the DC voltage input from the adder unit 35 to the DDS circuit unit 36 rises. For this reason, the frequency of the saw-tooth wave output from the DDS circuit unit 36 increases and becomes 6 MHz when the DC voltage corresponding to 6 MHz is input to the DDS circuit unit 36. As a result, the PLL is locked as illustrated in FIG. 5. At this time, the DC voltage output from the loop filter 34 becomes a value corresponding to Δfr−(f2−f1)=−1 MHz. That is, it can be said that the integral value of the loop filter 34 corresponds to an integral value of the change amount of 1 MHz when the saw-tooth wave changes from 5 MHz to 6 MHz.

Figure 6:
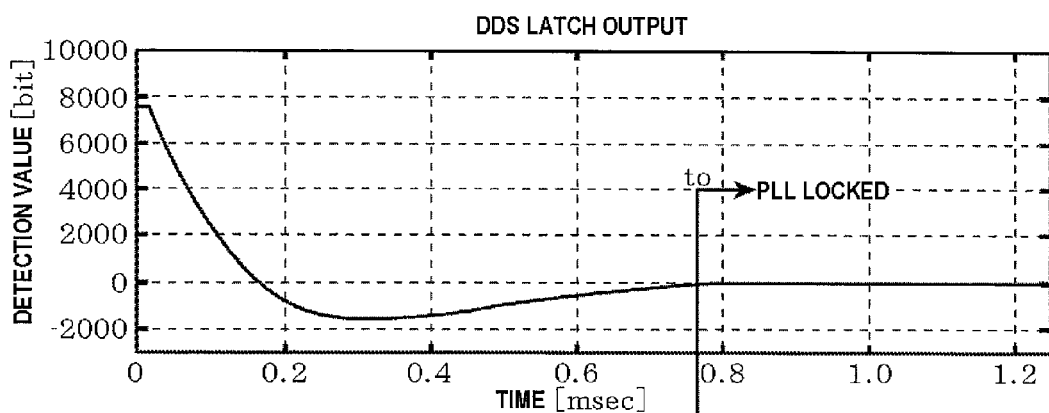
FIG. 6 includes part (a) and part (b), and illustrates waveforms at each unit of the aforementioned loop in an actual device according to the embodiment described above.
Figure 6:
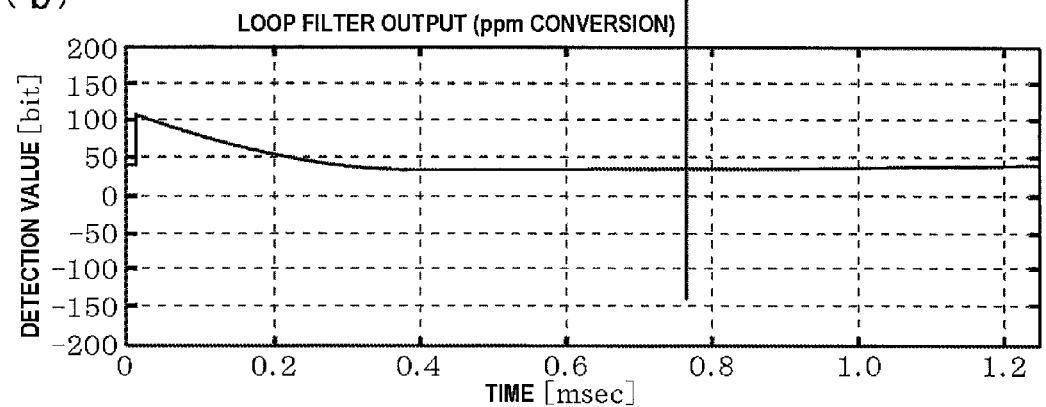

On the contrary, in a case where Δfr is 6 MHz, and (f2−f1) is 5 MHz, the latch pulse has a period longer than that of the saw-tooth wave. Therefore, the latch point of part (a) of FIG. 4 gradually rises, so that the output of the latch circuit 33 and the output of the loop filter 34 also increase. For this reason, since the subtracted value increases in the adder unit 35, the frequency of the saw-tooth wave gradually falls down, and at last, the PLL is locked when (the frequency) becomes 5 MHz equivalent to (f2−f1). At this time, the DC voltage output from the loop filter 34 becomes a value corresponding to Δfr−(f2−f1)=1 MHz. FIG. 6 shows actual measurement data. In this example, the PLL is locked at time t0.

However, in practice, the output of the frequency difference detection unit 3, that is, the output of the averaging circuit 37 of FIG. 2 has a value represented as a value {(f2−f1)/f1}−{(f2r−f1r)/f1r} (34-bit digital value) as described above. If a set of these values from the vicinity of −50° C. to the vicinity of 100° C. are expressed as (f1−f1r)/f1r=OSC1 (ppm or ppb) and (f2−f2r)/f2r=OSC2 (ppm or ppb), a change against the temperature becomes a curve substantially equal to OSC2−OSC1. Therefore, the output of the frequency difference detection unit 3 can be treated as OSC2−OSC1=temperature data.

In the flip-flop 31, since the operation for latching the frequency f2 on the frequency f1 is unsynchronous, there is a possibility that an uncertain period such as a metastable period is generated, so that an instantaneous error may be included in the output of the loop filter 34 (during the metastable period, the output becomes unstable because the clock and the input data are nearly simultaneously changed although it is necessary to hold the input data for a predetermined time before and after the latching edge when the input data are latched on the edge of the clock). In the aforementioned PLL, the output of the loop filter 34 is treated as a difference between (f2−f1) and Δfr which is a value corresponding to a temperature. Therefore, the averaging circuit 37 for obtaining a moving average of the input value at a predetermined time is provided in the output side of the loop filter 34 to remove the instantaneous error. Using the averaging circuit 37, it is possible to finally obtain frequency deviation information corresponding to a fluctuating temperature with high accuracy.

Figure 7:
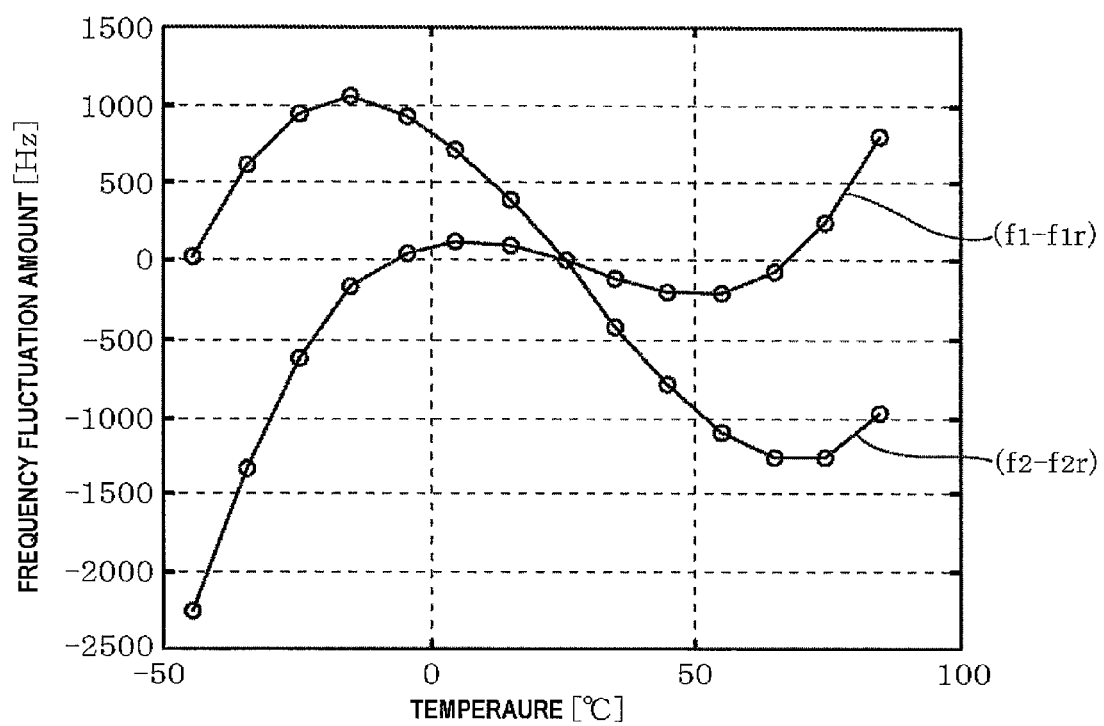
FIG. 7 is a frequency temperature characteristic diagram illustrating a relationship between a frequency f1 of the first oscillation circuit, a frequency f2 of the second oscillation circuit, and a temperature.

The frequency deviation information corresponding to a fluctuating temperature obtained by the loop filter 34 of the PLL (in this example, Δf−(f2−f1)) is input to the correction value computation unit 4 of FIG. 1 so as to compute the frequency correction value. Before describing the correction value computation unit 4, the frequency deviation information and the frequency correction value will be described with reference to FIGS. 7 to 10. FIG. 7 is a characteristic diagram illustrating a temperature-frequency relationship by normalizing the frequencies f1 and f2 using the reference temperature. Here, the normalization refers to an operation for obtaining a relationship between a temperature and a frequency deviation from the frequency at the reference temperature by setting the reference temperature to, for example, 25° C. and setting the frequency at the reference temperature to zero in a temperature-frequency relationship. If f1r denotes a frequency at a temperature of 25° C. in the first oscillation circuit 1, and f2r denotes a frequency at a temperature of 25° C. in the second oscillation circuit 2, that is, if the frequencies f1 and f2 at a temperature of 25° C. are denoted by f1 r and f2r, respectively, the values plotted on the ordinate of FIG. 7 are (f1−f1r) and (f2−f2r).

Figure 8:
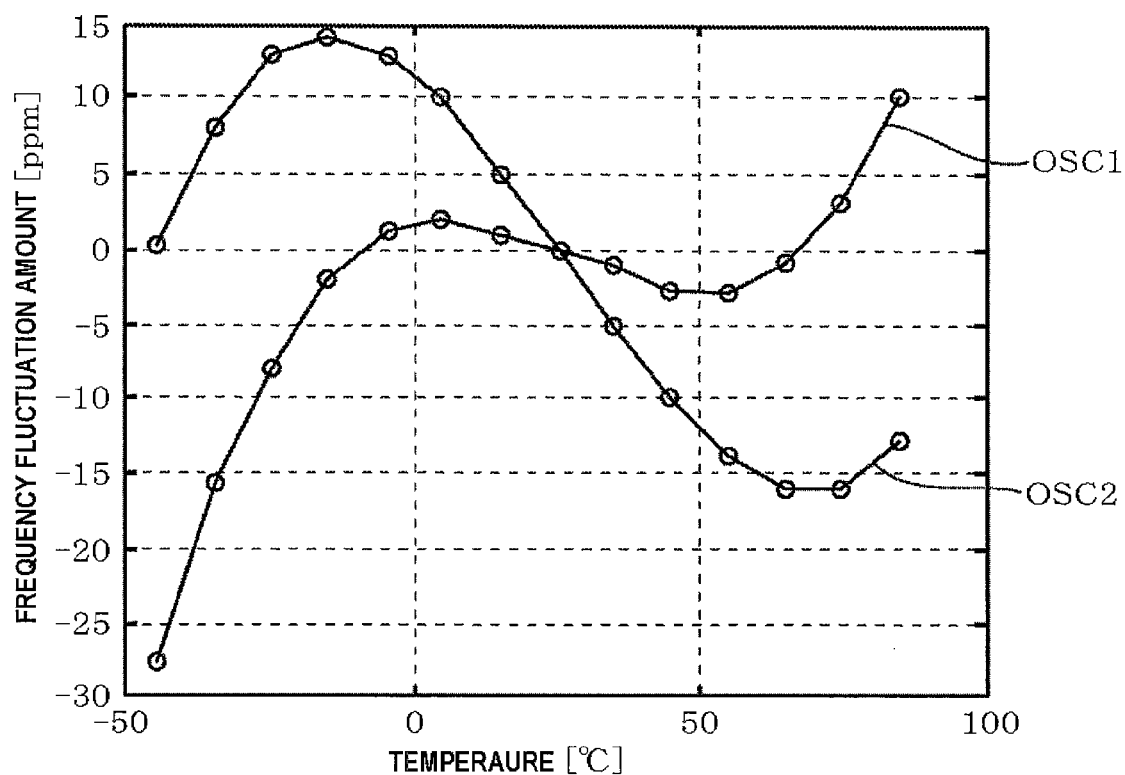
FIG. 8 is a frequency temperature characteristic diagram illustrating a relationship between values obtained by normalizing the frequencies f1 and f2 and a temperature.

FIG. 8 illustrates a frequency change ratio at the reference temperature of 25° C. for the frequencies at each temperature illustrated in FIG. 7. Therefore, the values plotted on the ordinate of FIG. 8 are (f1−f1r)/f1r and (f2−f2r)/f2r, which are denoted by OSC1 and OSC2, respectively. In addition, values on the ordinate in FIG. 8 are plotted in the unit of ppm.

Here, returning to description of the frequency difference detection unit 3, the frequency difference detection unit 3 according to the present embodiment performs a computation for obtaining OSC2−OSC1 instead of (f2−f2r)−(f1−f1r)=f2−f1−Δfr as described above. That is, for values of ratios representing how much each frequency is deviated from the reference temperature, a difference between the ratio at the frequency f2 and the ratio at the frequency f1 is obtained. Although the frequency signal corresponding to (f2−f1) is input to the latch circuit 33, the saw-tooth wave is input to the inside of the PLL loop. Therefore, the circuit may be provided so as to perform such a computation. If the output of the frequency difference detection unit 3 is a 34-bit digital value, for example, a value of 0.058 ppb per bit is allocated. Therefore, the value of OSC2−OSC1 has accuracy up to 0.058 ppb. A fact that the value of 0.058 ppb per bit can be set is based on Equations (2) to (4) described below. In this stage, FIG. 6 illustrate output values of the latch circuit 33 and the loop filter 34, respectively, incorporated into an actual circuit in a case where the frequency difference OSC2−OSC1 between f1 and f2 (specifically, a difference between frequency change ratios) is 40 ppm.

Figure 9:
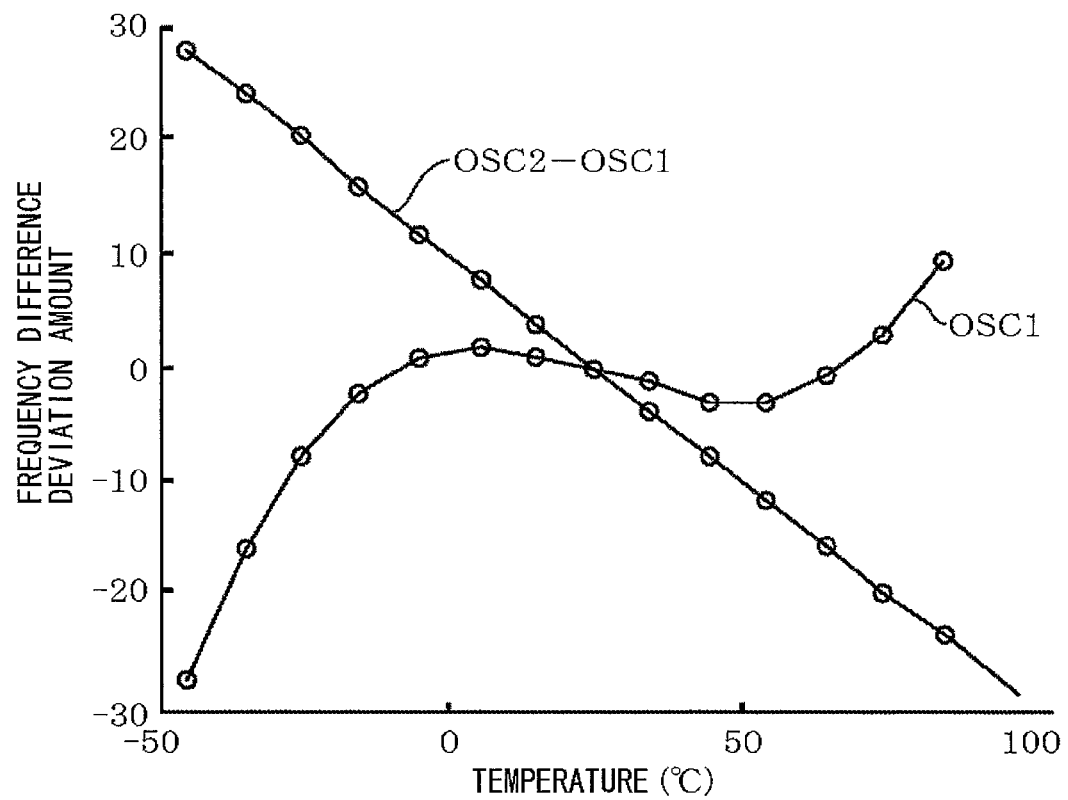
FIG. 9 is a frequency temperature characteristic diagram illustrating a relationship between a value obtained by normalizing the frequency f1 and a temperature and a relationship between a difference ΔF between a value obtained by normalizing the frequency f1 and a value obtained by normalizing the frequency f2 and a temperature.

FIG. 9 illustrates a relationship between a temperature and OSC1 and a relationship between a temperature and (OSC2−OSC1). From FIG. 9, it is recognized that there is a linear relationship between (OSC2−OSC1) and a temperature. Therefore, it is recognized that (OSC2−OSC1) corresponds to a temperature fluctuation deviation amount from the reference temperature. In general, the frequency temperature characteristic of the crystal unit is expressed as a 3rd-order function. Therefore, if a relationship between (OSC2−OSC1) and the frequency correction value for canceling the frequency fluctuation amount using the 3rd-order function is obtained, the frequency correction value can be obtained based on the detection value of (OSC2−OSC1).

Figure 10:
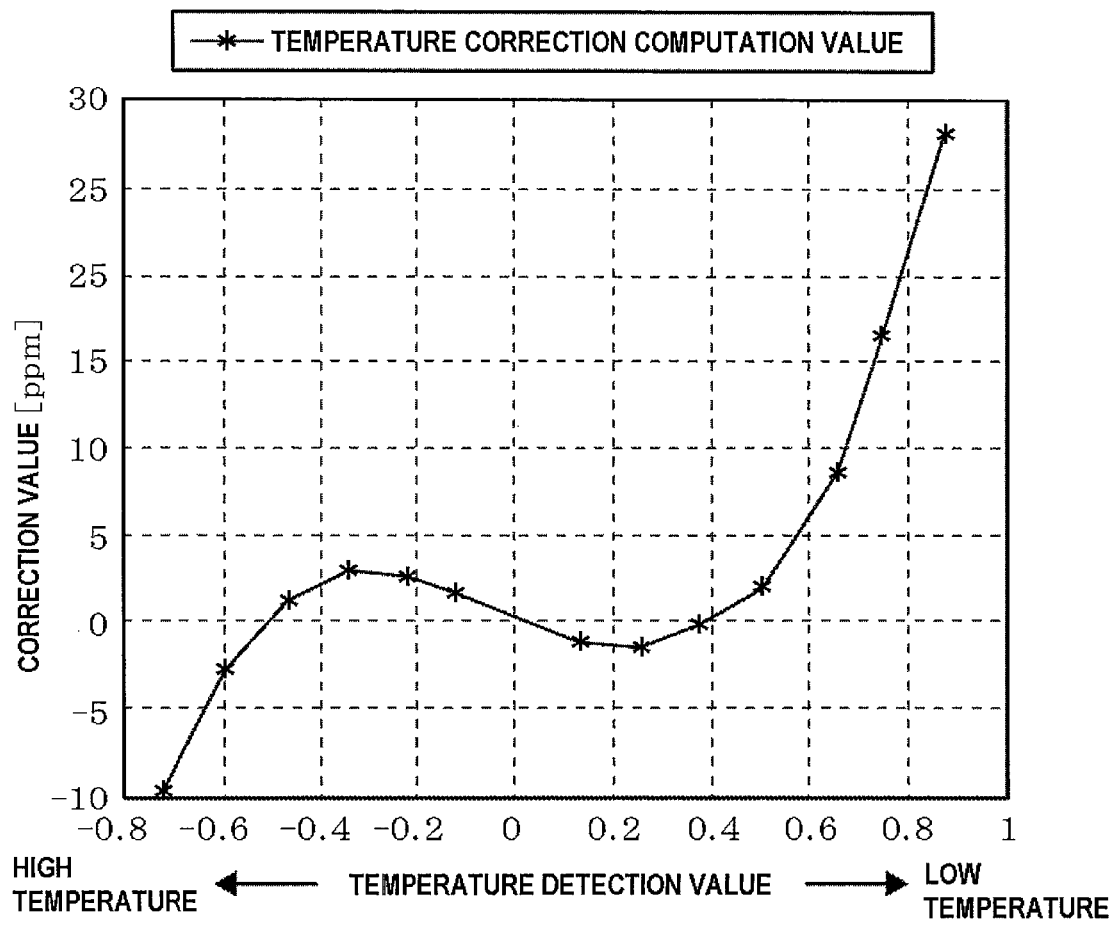
FIG. 10 is a characteristic diagram illustrating a relationship between a value obtained by normalizing the ordinate of FIG. 9 and a frequency correction value.

In the oscillator device according to the present embodiment, the frequency signal f1 obtained from the first oscillation circuit 1 is used as a reference clock of the control circuit unit 200 of FIG. 1 as described above. Since the reference clock has a frequency temperature characteristic, temperature correction is performed for the frequency of the reference clock. For this reason, a function expressing a relationship between a temperature and the frequency signal f1 normalized with the reference temperature is obtained in advance, and a function for canceling the frequency fluctuation amount of the frequency signal f1 is obtained using this function as illustrated in FIG. 10. Therefore, the ordinate of FIG. 10 denotes −OSC1. In this example, in order to perform temperature correction with high accuracy, the aforementioned function is set to, for example, a 9th-order function.

Since there is a linear relationship between a temperature and (OSC2−OSC1) as described above, the ordinate denotes a value of (OSC2−OSC1) in FIG. 10. However, if the value of (OSC2−OSC1) is directly used, the amount of data for specifying this value increases. Therefore, the value of (OSC2−OSC1) is normalized as described below. Specifically, an upper limit temperature and a lower limit temperature to be used by the oscillator device in practice are defined, so that the value of (OSC2−OSC1) at the upper limit temperature is set to +1, and the value of (OSC2−OSC1) at the lower limit temperature is set to −1. In this example, as illustrated in FIG. 10, −30 ppm is set to +1, and +30 ppm is set to −1.

The frequency characteristic against a temperature of the crystal unit is treated as a 9th-order polynomial approximation formula in this example. Specifically, the relationship between (OSC2−OSC1) and a temperature are obtained through actual measurement during manufacturing of the crystal unit. Based on this actual measurement data, a correction frequency curve representing a relationship between −OSC1 and a temperature for cancelling the frequency fluctuation amount against a temperature is obtained, and the 9th-order polynomial approximation coefficient is obtained using a least-square method. In addition, the polynomial approximation coefficients are stored in the memory 30 (refer to FIG. 1) in advance, and the correction value computation unit 4 performs a computation process of Equation (1) using the polynomial approximation coefficients.

$$Y = P1 \cdot X^9 + P2 \cdot X^8 + P3 \cdot X^7 + P4 \cdot X^6 + P5 \cdot X^5 + P6 \cdot X^4 + P7 \cdot X^3 + P8 \cdot X^2 + P9 \cdot X \quad (1)$$

In Equation (1), X denotes frequency difference detection information, Y denotes correction data (corresponding to the first correction value), and P1 to P9 denote polynomial approximation coefficients.

Here, X denotes a value obtained by the frequency difference detection unit 3 of FIG. 1, that is, the value (OSC2−OSC1) obtained by the averaging circuit 37 of FIG. 2.

In addition, the correction value computation unit 4 has a function of obtaining a second correction value in addition to the first correction value described above in order to reduce a correction residual error (a difference between the first correction value and the actual measurement value of the correction value) remaining without being corrected only using the polynomial approximation formula (first approximation formula) expressed in Equation (1).

Figure 11:
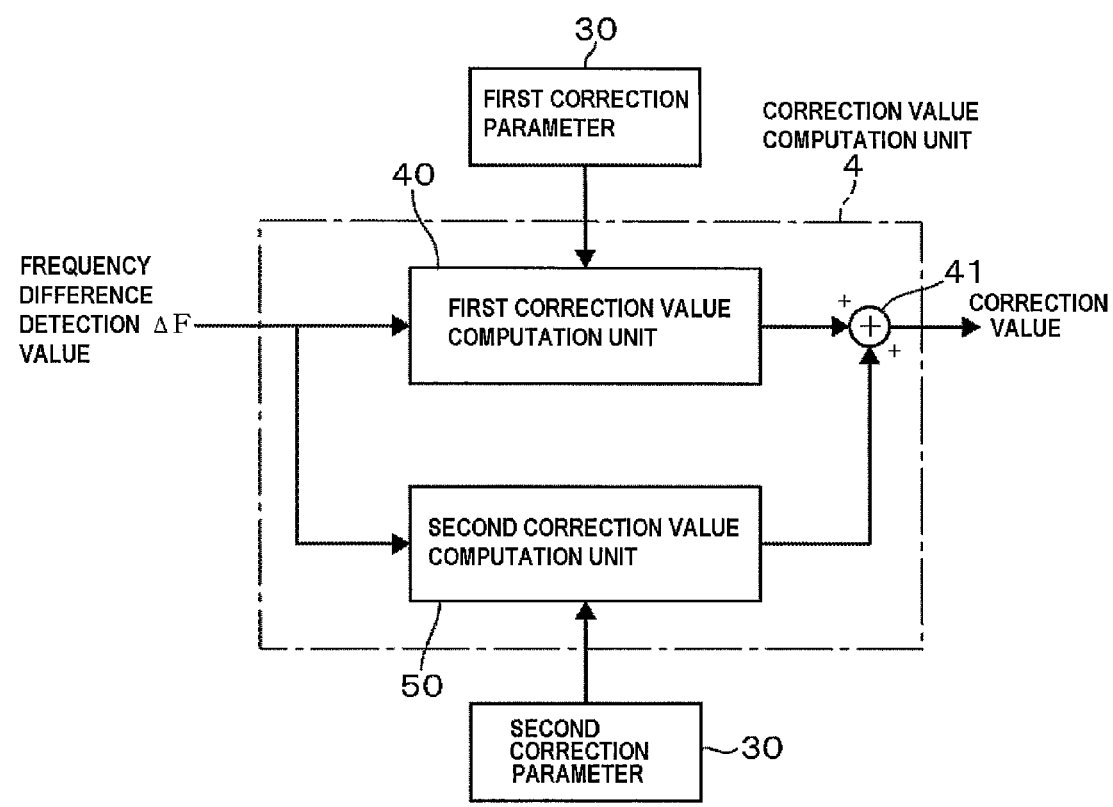
FIG. 11 is a block diagram illustrating a correction value computation unit.

FIG. 11 illustrates an exemplary block diagram for performing a computation in the correction value computation unit 4. In the correction value computation unit 4, the adder unit 41 adds the correction data (first and second correction values) computed by the first correction value computation unit (first correction value acquisition unit) 40 and the second correction value computation unit (second correction value acquisition unit) 50, respectively, based on the correction parameter read from the memory 30, and the addition result is output as a frequency correction value. In addition, the frequency difference detection value ΔF is input to the first and second correction value computation units 40 and 50 in FIG. 11, and {(f2−f1)/f1}−{(f2r−f1r)/f1r} is used as the value corresponding to ΔF according to the present embodiment as described above.

Figure 12:
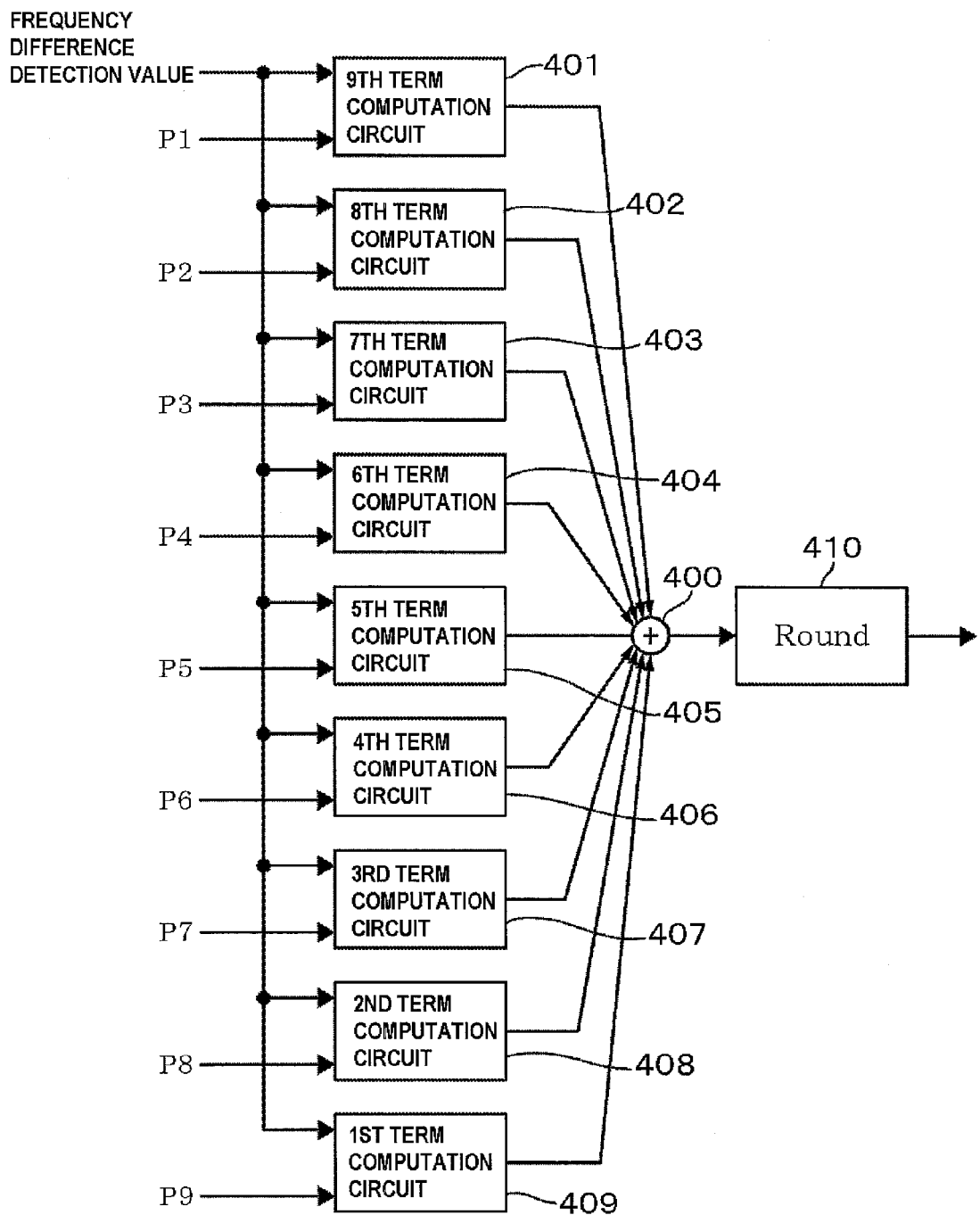
FIG. 12 is a block diagram illustrating a first correction value computation unit provided in the correction value computation unit.

First, a configuration of the first correction value computation unit 40 for performing a computational process of the correction data (first correction value) based on the polynomial approximation formula expressed in Equation (1) is illustrated in FIG. 12. In FIG. 12, reference numerals 401 to 409 denote computation units for performing a computation of each term in Equation (1), and reference numeral 400 denotes the adder unit, and reference numeral 410 denotes a circuit for performing a rounding process. In the first correction value computation unit 40, for example, a single multiplier may be repeatedly used to obtain a value of the 9th term, a value of the 8th term, and so on, and the values of each term may be added finally. In addition, the computation formula for the correction value is not limited to the 9th-order polynomial approximation formula, and the order of the approximation formula may be selected depending on the necessary accuracy.

In this manner, the first correction value computation unit 40 computes the correction data (first correction value) using the 9th-order polynomial approximation formula obtained through the least-square method to correct the frequency characteristic depending on the temperature of the crystal unit. However, even when a relatively high order polynomial is used in this manner, the approximation formula does not strictly recover the frequency temperature characteristic described above.

Figure 13:
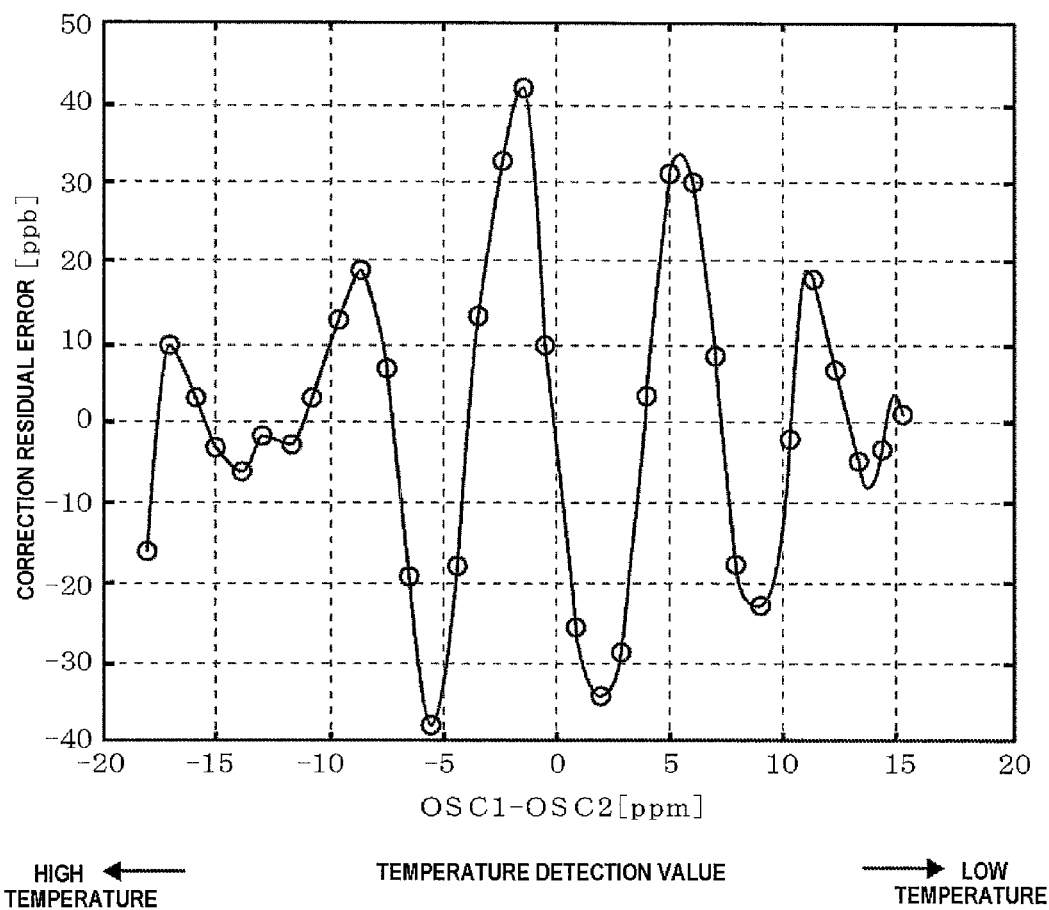
FIG. 13 is a characteristic diagram illustrating a relationship between the difference value ΔF and the correction residual error.

For example, in FIG. 13, the solid line denotes a temperature characteristic of the correction residual error described above, the abscissa denotes a difference value between OSC1 and OSC2 corresponding to the temperature detection value (OSC2−OSC1 [ppm]), and the ordinate denotes the correction residual error. When the correction residual error is computed, −OSC1 (=(f1−f1r)/f1r) obtained from the oscillation frequency f1 of the first oscillation circuit 1 actually measured by changing a temperature around the first and second crystal units 10 and 20 and the oscillation frequency f1r of the first oscillation circuit 1 at the reference temperature (25° C.) is set to the frequency correction value actually measured. In addition, the correction residual error resonator is obtained from a difference between the correction data obtained from the polynomial approximation formula described above (first correction value) and the frequency correction value actually measured.

Referring to FIG. 13, there is a correction residual error of, approximately, ±40 [ppb] between the first correction value obtained from the polynomial approximation formula expressed in Equation (1) and the frequency correction value actually measured. In a case where high-accuracy temperature compensation is performed, it is preferable that the correction residual error be reduced more.

In this regard, the correction value computation unit 4 of the present example obtains the second correction value corresponding to the correction residual error in addition to the first correction value and obtains the frequency correction value by adding the first and second correction values to increase the temperature compensation accuracy. The second correction value computation unit 50 of FIG. 11 serves as the second correction value acquisition unit that obtains the second correction value based on the value corresponding to the difference value described above.

As described above, the second correction value computation unit 50 obtains the second correction value based on the correction residual error which is a difference between the first correction frequency and the correction frequency actually measured. For example, as indicated by the solid line in FIG. 13, the correction residual error is stored in advance with a narrow interval such that it looks like nearly continuous data (for example, an interval corresponding to the computation accuracy corresponding to the difference value), and a specific correction residual error is set to the second correction value depending on the computation result corresponding to the difference value. As a result, it is possible to perform more accurate correction.

However, in this case, a large capacity memory is necessary, and a temperature characteristic of the correction residual error is different in each crystal unit 10. Therefore, actual measurement of enormous correction residual errors for each of the crystal units 10 provided in the overall oscillator devices is not realistic.

In this regard, in the first correction value computation unit 40 of this example, a group of values corresponding to difference values arranged with a predetermined interval are set, and a correction residual error is obtained from the difference values belonging to this group. Then, the second correction value for the value ΔF corresponding to the difference value obtained from the frequency difference detection unit 3 is computed by interpolating the correction residual errors obtained for the values corresponding to the neighboring difference values using the linear function.

Figure 14:
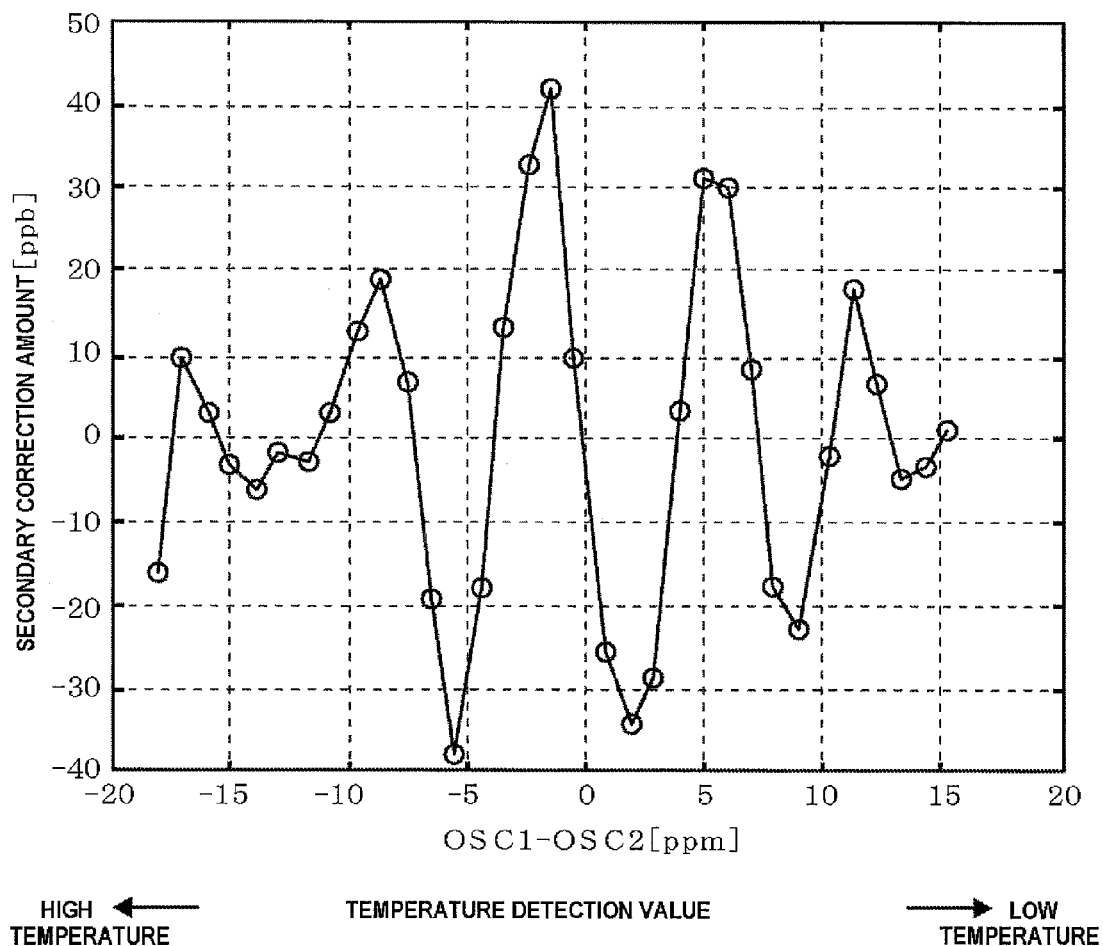
FIG. 14 is a characteristic diagram obtained by plotting the aforementioned correction residual errors for each difference value at a predetermined interval.

For example, referring to FIG. 13, a range of the value (OSC2−OSC1) corresponding to the difference value is divided into 32 points, and they are used as acquisition points of the correction residual errors. The obtained correction residual errors are plotted as blank circles. FIG. 14 illustrates an approximation characteristic diagram obtained by interpolating neighboring plots in an abscissa direction (arrangement sequence of the values corresponding to the difference values) using a linear function (straight line), as to the correction residual errors of FIG. 13. The second correction value computation unit 50 of this example obtains the second correction value using the approximation formula of the correction residual errors linearly interpolated.

Hereinafter, a configuration and an effect of the second correction value computation unit 50 for obtaining the second correction value will be described with reference to FIGS. 15 to 17. As described above, in this example, {(f2−f1)/f1}−{(f2r−f1r)/f1r} is employed as the value ΔF corresponding to the difference value output from the frequency difference detection unit 3. However, from the viewpoint of easy understanding, in the description of FIGS. 15 to 17, ΔF=f2−f1−Δfr [Hz] is employed as the value corresponding to the difference value.

Figure 15:
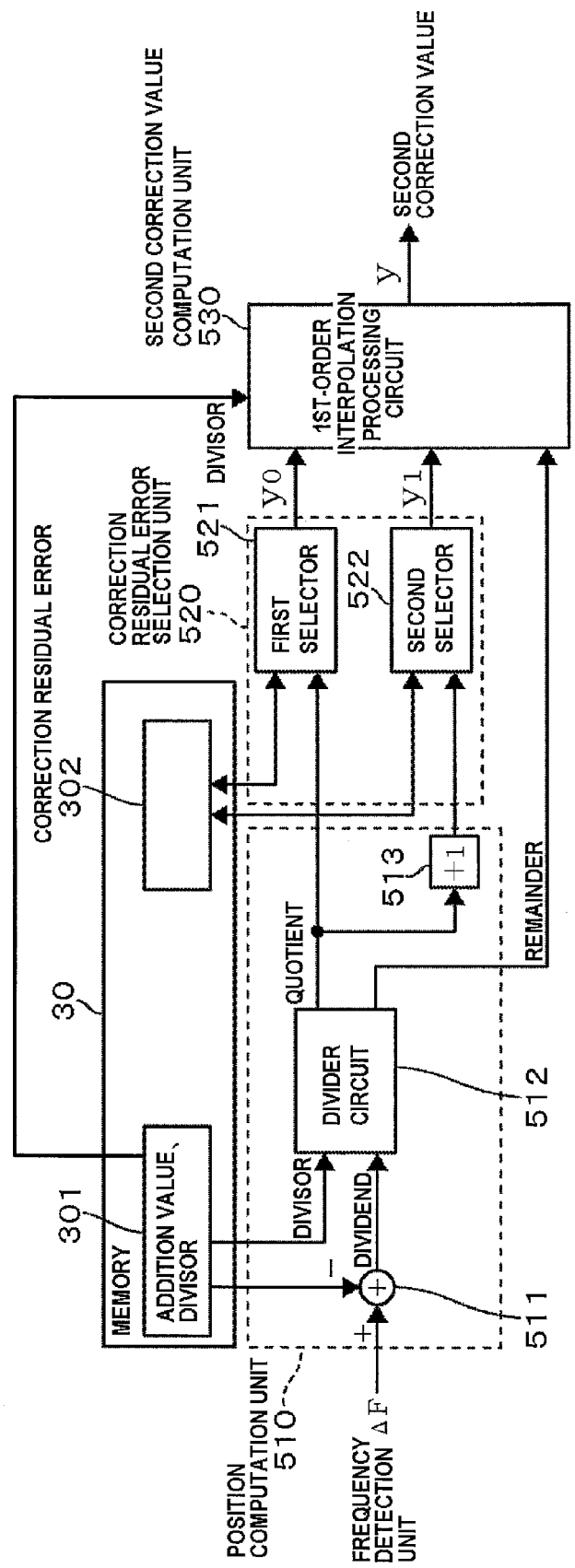
FIG. 15 is a block diagram illustrating a second correction value computation unit provided in the correction value computation unit described above.

FIG. 15 is a block diagram illustrating a configuration of the second correction value computation unit 50. Schematically, the second correction value computation unit 50 includes: a position computation unit 510 that divides ΔF obtained from the frequency difference detection unit 3 by a predetermined divisor and outputs information for determining where the ΔF is located in the correction residual error sections of FIG. 14; a correction residual error selection unit 520 that selects the correction residual errors at the positions of both ends of the section where the ΔF belongs based on the information obtained from the position computation unit 510; and a second correction value computation unit 530 that obtains the linear function (second approximation formula) for interpolating both correction residual errors selected by the correction residual error selection unit 520 and computes the second correction value corresponding to the ΔF from the linear function.

The position computation unit 510 includes: an adder unit 511 that adds the addition value stored in the division parameter table 301 of the memory 30 to ΔF obtained from the frequency difference detection unit 3 and outputs a result thereof as a dividend; a divider circuit 512 that divides the dividend obtained from the adder unit 511 by the divisor stored in the division parameter table 301, outputs the integer part of the division result (denoted by "quotient" in FIG. 15) as an index value corresponding to the lower end side of the section where the ΔF belongs, and outputs a remainder of the division result (denoted by "remainder" in FIG. 15) to the second correction value computation unit 530; and an integer adder unit 513 that adds "1" to the index value of the lower end side output from the divider circuit 512 and outputs a result thereof as an index value of the upper end side of the section where the ΔF belongs.

Figure 16:
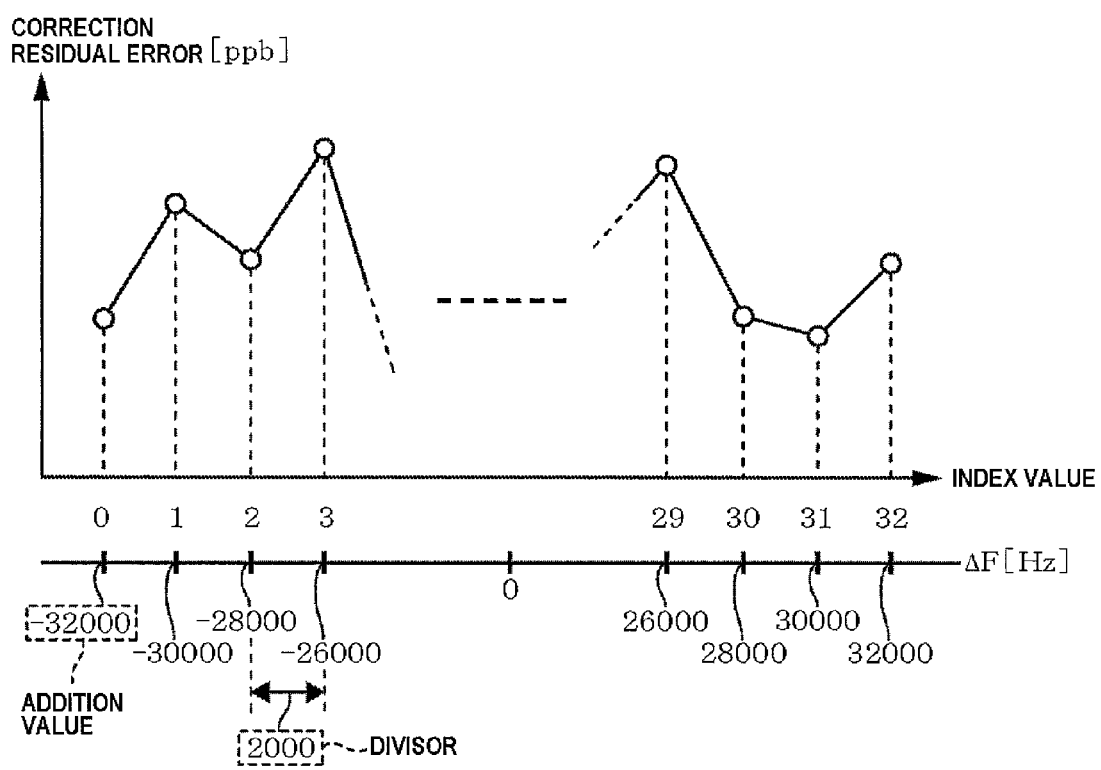
FIG. 16 is a first explanatory diagram illustrating the effect of the second correction computation unit described above.

FIG. 16 schematically illustrates a graph obtained by assigning index values 0 to 32 to 33 acquisition points obtained by dividing a range "−32000ΔF32000" into 32 sections per 2000 Hz sequentially from the index value having a smaller ΔF and plotting the correction residual errors [ppb] depending on each index value.

The division parameter table 301 stores the lower end value "−32000" of the range of ΔF as the addition value and a sectional unit "2000" for dividing the range of ΔF as the divisor. Here, for example, if a value "ΔF=−27500" is input from the frequency difference detection unit 3, the adder unit 511 reverses the sign of the addition value and adds it to the ΔF (i.e., −27500−(−32000)=4500), so that the result is output as the dividend.

The divider circuit 512 divides the dividend "4500" obtained from the adder unit 511 by the divisor "2000" read from the division parameter table 301 and outputs the integer part "2" of the division result "2.25" as a quotient and a remaining part "500" as a remainder.

Meanwhile, as recognized from FIG. 16, "ΔF-27500" obtained from the frequency difference detection unit 3 is included in the section "−28000≤ΔF≤−26000." If a computation is performed using the adder unit 511 and the divider circuit 512 for the lower end value "−28000," the quotient becomes "2", and the remainder becomes "0." The 33 acquisition points obtained by dividing the range of ΔF in this manner are provided in positions where the remainder becomes "0" through the aforementioned computation in the unit of multiples of "2000." In addition, the quotient values obtained by performing the aforementioned computation at each acquisition point are employed as an index value for selecting the correction residual error.

If a relationship between the index value and the value of ΔF of each acquisition point is established as described above, the quotient value output from the divider circuit 512 indicates the index value of the lower end in the section where ΔF obtained from the frequency difference detection unit 3 belongs. In addition, if the integer adder unit 513 adds "1" to the quotient output from the divider circuit 512, the resulting value becomes equal to the index value corresponding to the acquisition point in the upper end side of the aforementioned section.

As a result, the index values in the upper end side and the lower end side of the section where ΔF obtained from the frequency difference detection unit 3 belongs are specified and are output to the first and second selectors 521 and 522, respectively, provided in the correction residual error selection unit 520. The first and second selectors 521 and 522 complete the role of reading the values of the correction residual errors from the correction residual error table 302 in the memory 30 and outputting them to the second correction value computation unit 530.

As shown in Table 1, the correction residual error table 302 stores the correction residual errors measured in advance based on the oscillation frequency f1 of the first crystal unit 10 and the first correction value obtained from the polynomial approximation formula by mapping the index values. Each selector 521 and 522 selects the correction residual error based on the index values obtained from the position computation unit 510. As a result, it is possible to obtain the correction residual errors corresponding to ΔF of the upper end side and the lower end side in the section where the ΔF obtained from the frequency difference detection unit 3 belongs. In this example, the first selector 521 selects the correction residual error corresponding to ΔF of the lower end side of the aforementioned section, and the second selector 522 selects the correction residual error corresponding to ΔF of the upper end side.

TABLE 1

| INDEX VALUE | PARAMETER VALUE |
|---|---|
| 0 | CORRECTION RESIDUAL ERROR 0 |
| 1 | CORRECTION RESIDUAL ERROR 1 |
| 2 | CORRECTION RESIDUAL ERROR 2 |
| . | . |
| . | . |
| . | . |
| 32 | CORRECTION RESIDUAL ERROR 32 |

Here, x0 denotes a value corresponding to the acquisition point in the lower end side of the section where the ΔF obtained from the frequency difference detection circuit 3 belongs, x1 denotes a value corresponding to the acquisition point in the upper end side, x denotes the ΔF described above, and y0 and y1 denote the correction residual errors selected based on the index values corresponding to the acquisition points in the lower end side and the upper end side, respectively. In this case, as illustrated in FIG. 17, if a gap between the point P0(x0, y0) and the point P1(x1, y1) is interpolated using a linear function, it is possible to obtain an approximation formula (second approximation formula) for estimating the value y. According to the present embodiment, the value y obtained by applying x to this approximation formula is set to the second correction value.

Figure 17:
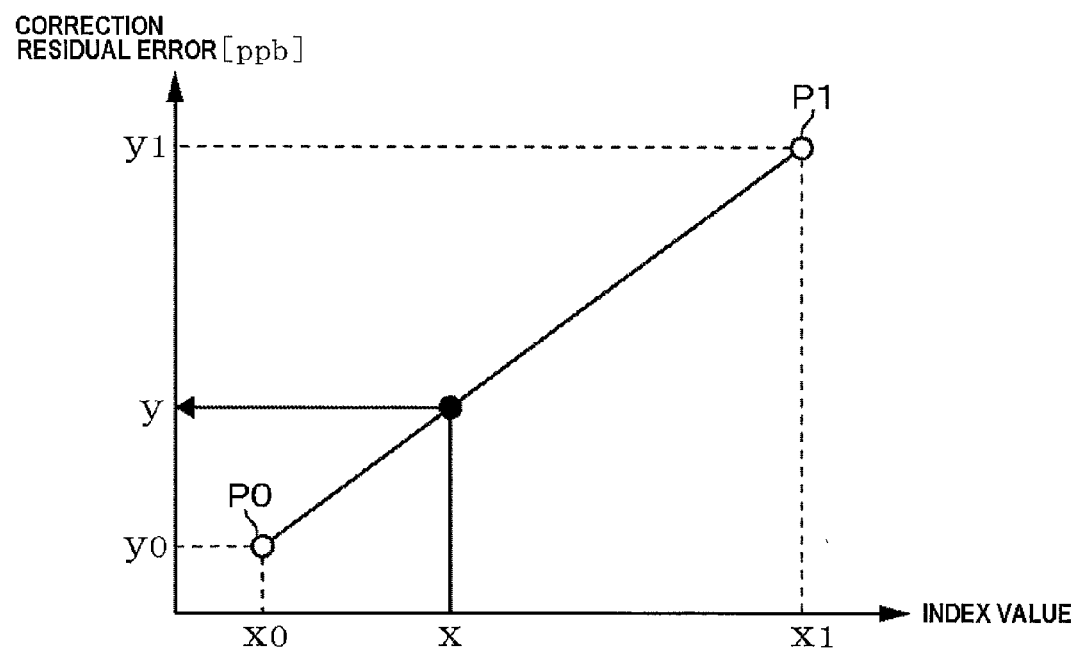
FIG. 17 is a second explanatory diagram illustrating the effect of the second correction computation unit described above.

Referring to FIG. 17, the approximation formula described above is expressed in Equation (2) as follows:

$$(y-y0)/(y1-y0)=(x-x0)/(x1-x0) \qquad (2)$$

Here, the interval between neighboring acquisition points "x1−x0" serves as a divisor, and "x−x0" serves as a remainder. Therefore, Equation (2) may be rewritten as Equation (2)' as follows.

$$y=\{(\text{remainder})\cdot(y1-y0)/(\text{divisor})\}+y0 \qquad (2)'$$

The second correction value computation unit 530 computes Equation (2)' based on y0 obtained from the first selector 521, y1 obtained from the second selector 522, the remainder obtained from the divider circuit 512, and the divisor read from the division parameter table 301 and outputs the resulting value as the second correction value.

Next, the entire operation according to the embodiment described above will be described. The frequency signal output from the first oscillation circuit 1 is supplied to the control unit 200 of the voltage controlled oscillator 100 as a clock signal. As described at the beginning of the present embodiment, the frequency signal having a desired frequency is output from the voltage controlled oscillator 100 through the control operation of the control unit 200. Meanwhile, the frequency signals f1 and f2 output from the first and second oscillation circuits 1 and 2, respectively, are input to the frequency difference detection unit 3. The PLL is locked when the output ΔF of the PLL, which is the output of the frequency difference detection unit 3 in this example, becomes a value corresponding to {Δfr−(f2−f1)}, in this example, (OSC2−OSC1) through the operation described above. In addition, this value is input to the correction value computation unit 4, and the first correction value computation unit 40 performs the computation of Equation (1) to obtain the first correction value. The second correction value computation unit 50 reads the correction residual error of the section where ΔF belongs from the memory 30 and executes the computation of Equation (2)' to obtain the second correction value. In addition, the first and second correction values are added in the adder unit 41 (in this case, the units of the first and second correction values are set to, for example, ppm), and the resulting value is output as the frequency correction value.

The computation of Equation (1) is a process of obtaining a value on the ordinate of the approximation curve of the correction frequency corresponding to a value obtained based on the output value of the frequency difference detection unit 3, for example, in the characteristic diagram of FIG. 10. In addition, the computation of Equation (2)' is a process of obtaining a value on the ordinate of the approximation curve of the correction residual error corresponding to a value obtained based on the output value of the frequency difference detection unit 3 in the characteristic diagram of FIG. 14.

Figure 18:
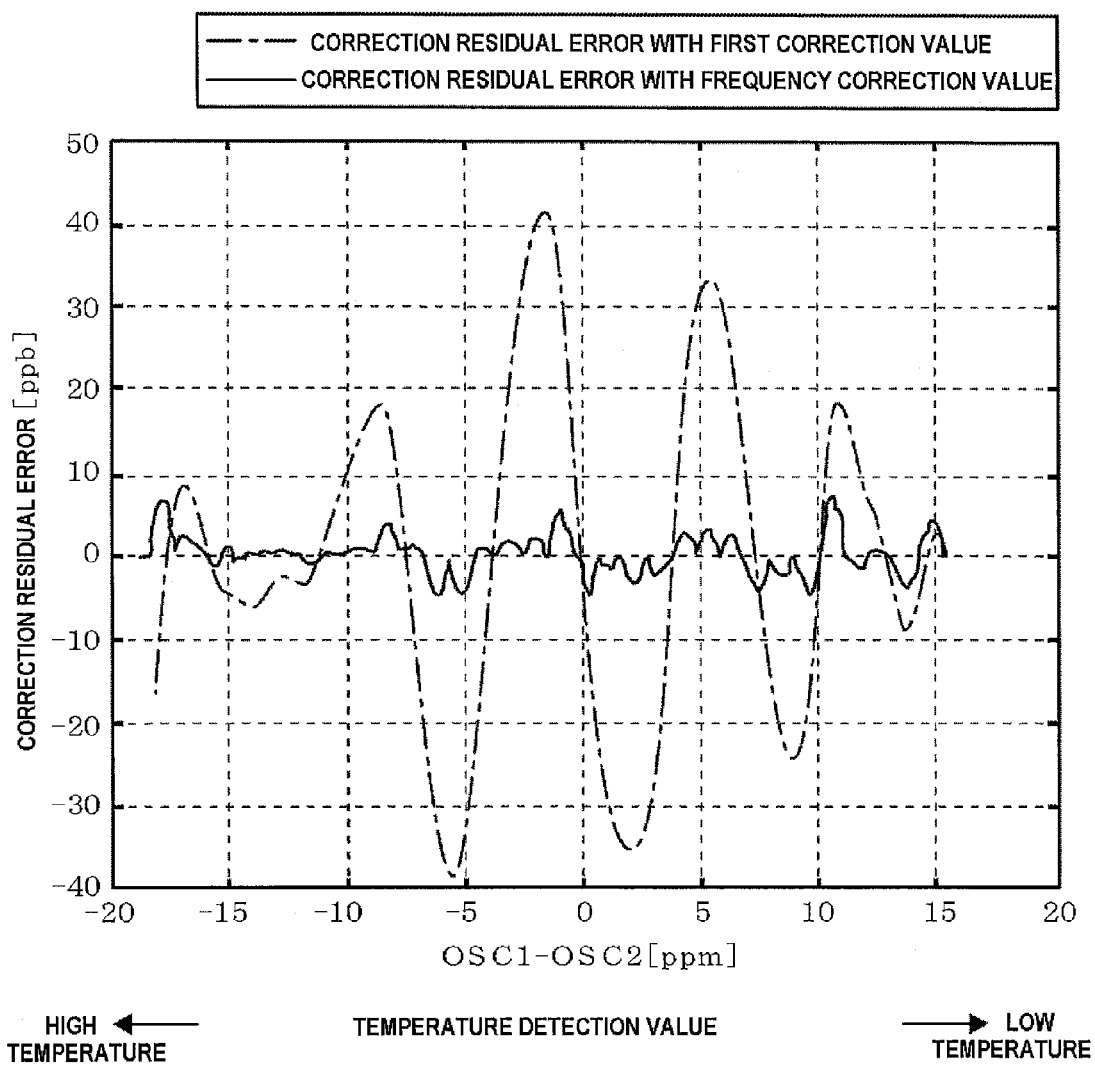
FIG. 18 is a characteristic diagram illustrating a relationship between the difference value ΔF and the correction residual error obtained after correction using the first and second correction values.

In FIG. 18, a difference (correction residual error) between the frequency correction value (sum of the first and second correction values) output from the correction value computation unit 4 and the frequency correction value actually measured is indicated by a solid line, and the correction residual error between the frequency correction value and the first correction value described in conjunction with FIG. 13 is indicated by a one-dotted chain line. Referring to FIG. 18 which illustrates the frequency correction value output from the correction value computation unit 4, the correction residual error to the frequency correction value actually measured is within a range of ±10 [ppb] and has a fluctuation range smaller than that of the correction residual error of the first correction value (±40 [ppb]). Therefore, it can be said that it is possible to improve the accuracy of the frequency correction value by adding the second correction value obtained using the approximation formula of Equation (2)' (second approximation formula) corresponding to the correction residual error to the first correction value obtained using the approximation formula of Equation (1) (first approximation formula).

As described above, the second correction value is computed using the correction residual error obtained based on the difference from the actually measured frequency correction value. Therefore, it is possible to considerably improve accuracy of the frequency correction value even by employing an approximation formula having a small number of parameters such as a linear function. Here, the inventors investigated the information amount of parameters necessary when accuracy having a level nearly equal to that of the case of FIG. 18 is implemented, for example, using a third-order spline interpolation computation formula ($y=ax^3+bx^2+cx+d$, where a, b, c, and d denote spline interpolation coefficients) as the approximation formula of the correction frequency converted into Equation (1). This results in 160 bytes at a rough estimation. On the contrary, the information amount of parameters necessary in Equations (1) and (2)' is 60 bytes, which corresponds to, approximately, 1/2.7 times.

Note that the approximation formula for computing the second correction value is not limited to the linear function described above. Instead, a spline interpolation using second or higher order polynomials or an approximation curve using a least-square method may be employed, depending on the memory capacity, etc. to be used. In addition, a coefficient may be applied to each correction value when the first and second correction values are added.

In addition, as illustrated in FIG. 1, the first and second crystal units 11 and 12 are configured using a common crystal element Xb and are thermally combined with each other. Therefore, the frequency difference between the oscillation circuits 11 and 12 is a value substantially accurately corresponding to the ambient temperature, and thus, the output of the frequency difference detection unit 3 is temperature difference information between the ambient temperature and the reference temperature (in this example, 25° C.). Since the frequency signal f1 output from the first oscillation circuit 11 is used as a main clock of the control unit 200, the correction value obtained from the correction value computation unit 4 is used as a signal for compensating the operation of the control unit 200 in order to cancel influence to the operation of the control unit 200 based on a frequency deviation amount of the frequency f1 caused by a temperature deviation from a temperature of 25° C. As a result, the output frequency of the voltage controlled oscillator 100 which is an output of the oscillator device 1 according to the present invention becomes stable regardless of a temperature fluctuation.

According to the aforementioned embodiment described above, it is possible to obtain accurate frequency deviation information corresponding to a temperature fluctuation amount even when the operational clock of itself is fluctuated depending on a temperature. As a result, it is possible to achieve an oscillator device with high stability and high accuracy. In addition, since a difference value between a value corresponding to a difference between f1 and f1r and a value corresponding to a difference between f2 and f2r is used as the frequency difference detection information (frequency deviation information of the fluctuating temperature amount), it is not necessary to provide a cumbersome work for adjusting the frequencies f1≈2 unlike Japanese Unexamined Patent Application No. 2001-292030. Furthermore, a problem that the product yield of the crystal unit is degraded is removed.

In addition, the PLL is configured such that, in order to obtain frequency difference detection information, a pulse of the difference frequency between f1 and f2 is created, the saw-tooth wave signal output from the DDS circuit unit is latched on the aforementioned pulse using the latch circuit, the latched signal value is integrated, and the integral value is output as the frequency difference, so that a difference between the output and the value corresponding to the difference between f1r and f2r is obtained and input to the DDS circuit unit. In a case where the frequencies f1 and f2 are counted, and a difference therebetween is obtained as in Japanese Unexamined Patent Application No. 2001-292030, the count time directly affects the detection accuracy. However, since such a problem is removed in this configuration, detection accuracy is improved. In practice, comparison was made between both methods through simulation by setting a count time of 200 ms in the method of counting the frequency. As a result, it was revealed that the method according to the present embodiment has detection accuracy about 50 times of the technique of the related art.

Since the PLL according to the present embodiment does not have a sinusoidal wave ROM table unlike the DDS circuit unit of the related art, it is advantageously possible to reduce a memory capacity and a device size. In addition, since the frequency correction value is obtained through a computation process based on the frequency deviation information corresponding to the fluctuating temperature, a memory having a large capacity is not necessary. From this viewpoint, it is also possible to reduce a device size and suppress costs.

Figure 19:
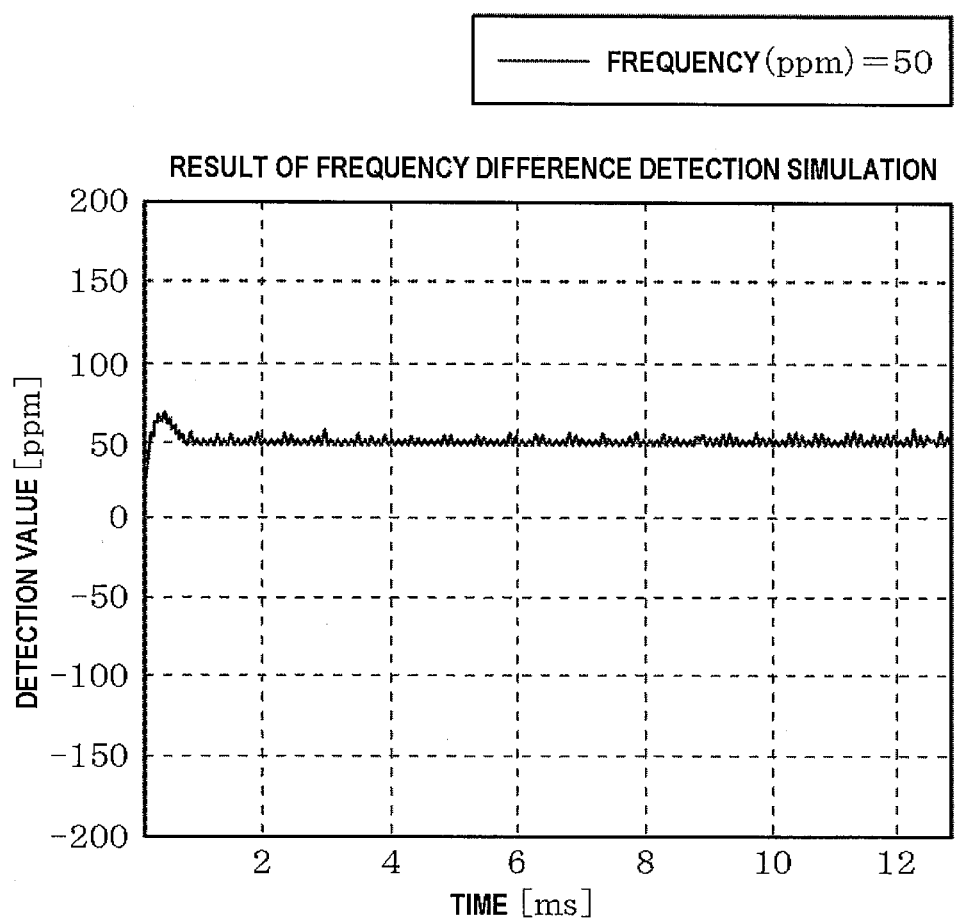
FIG. 19 is a characteristic diagram illustrating operational simulation of the frequency difference detection unit.

Here, a relationship between time and the frequency difference information output from the frequency difference detection unit 3 in a case where f1 is set to 81.9 MHz and f2 is set to 76.69 MHz was investigated using the circuit of FIG. 2. The result is illustrated in FIG. 19. In this case, the frequency difference information is set to (OSC2−OSC1), which is +50 ppm.

In summary, according to the present embodiment, a value corresponding to the difference between f1 and f1r refers to {(f1−f1r)/f1r} (=OSC1), and a value corresponding to the difference between f2 and f2r refers to {(f2−f2r)/f2r} (=OSC2). In addition, a value corresponding to the difference value between the value corresponding to the difference between f1 and f1r and the value corresponding to the difference between f2 and f2r refers to OSC2−OSC1. However, the present invention is not limited thereto. For example, the frequency difference detection unit 3 may use the difference value between (f1−f1r) and (f2−f2r) of itself as a value corresponding to the difference value between the value corresponding to the difference between f1 and f1r and the value corresponding to the difference between f2 and f2r. In this case, the temperature is obtained using the graph of FIG. 7.

In the description of FIGS. 8 to 10 according to the embodiment described above, the frequency change amount is denoted in the unit of [ppm]. However, since an actual digital circuit treats all data as a binary number, the frequency setting accuracy of the DDS circuit unit 36 is computed in the unit of bit such as 34 bits. For example, in a case where a clock of 10 MHz is supplied to the DDS circuit unit 201 of the control circuit unit 200 of FIG. 1, if this clock has a fluctuation frequency of 100 Hz, the following computation can be made:

$$100 \text{ Hz}/10 \text{ MHz} = 0.00001 \quad \text{[Computation of Fluctuation Ratio]}$$

$$0.00001 * 1e6 = 10 \text{ [ppm]} \quad \text{[ppm Conversion]}$$

$$0.00001 * 2^{\wedge}34 \approx 171{,}799 \text{ [ratio-34 bit(provisional name)]} \quad \text{[DDS Setting Accuracy Conversion]}$$

In the case of the configuration described above, the aforementioned frequency setting accuracy is expressed as Equation (3) as follows:

$$1 \times \text{[ratio-34 bit]} = 10 \text{ M[Hz]}/2^{\wedge}34 \approx 0.58 \text{ m[Hz/bit]} \quad (3)$$

Therefore, Equation (3) results in 100 [Hz]/0.58 m[Hz/bit] 171,799 [bit (ratio-34 bit)].

In addition, for 10 MHz, 0.58 mHz can be computed using Equation (4) as follows:

$$0.58 \text{ m[Hz]}/10 \text{ M[Hz]} * 1e9 \approx 0.058 \text{ [ppb]} \quad (4)$$

Therefore, the following Equation (5) can be established based on Equations (3) and (4):

$$1e9/2^{\wedge}34 = 0.058 \text{ [ppb/ratio-34 bit]} \quad (5)$$

That is, the frequency processed by the DDS circuit 36 is eliminated, so that only a relationship of bit numbers remains.

Although the crystal element Xb is commonly used between the first and second crystal units 10 and 20 in the example described above, the crystal element Xb may not be commonly used. In this case, for example, the first and second crystal units 10 and 20 may be arranged in a common casing. In this configuration, since both the first and second crystal units 10 and 20 are placed under the same temperature environment, the same effect can be obtained.

The output signal of the DDS circuit unit 36 of the frequency difference detection unit 3 may be a frequency signal having a signal value repeatedly rising and falling with time. For example, the output signal may be a sinusoidal wave.

In addition, the frequency difference detection unit 3 may be configured to count the frequencies f1 and f2 using a counter, subtract the value equivalent to Δfr from the difference value of the count value, and output a value corresponding to the obtained count value.

Figure 20:
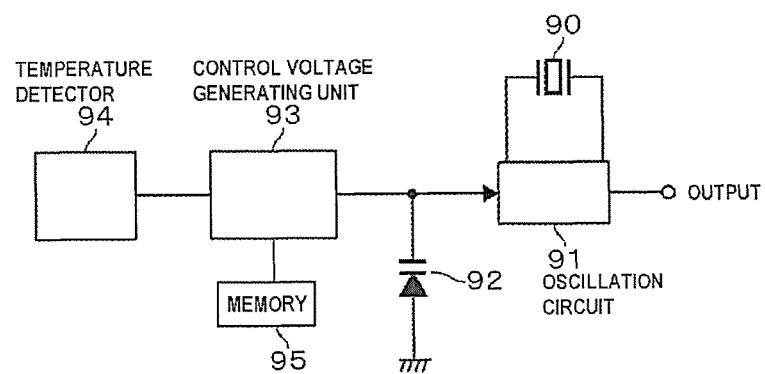
FIG. 20 is a block diagram illustrating a temperature compensated crystal oscillator (TCXO) in the related art.

The invention is not limited to the embodiments described above regarding the correction value obtained by the correction value computation unit 4. Other methods may be used in correction if the fluctuation amount of the output frequency can be canceled to be compensated using the correction value in a case where the output frequency of the oscillator device is fluctuated depending on a temperature. For example, in the TCXO of FIG. 20, a control voltage compensation amount suitable for the frequency correction amount may be obtained based on the frequency difference information obtained from the frequency difference detection unit 3 instead of the output of the temperature detector 94, and the control voltage generator unit 93 may generate the control voltage by adding the compensation amount and a reference voltage for outputting the frequency at the reference temperature. The invention is not limited to the embodiments described above regarding the technique of obtaining the frequency correction amount from the frequency difference information, which uses the polynomial approximation formula. For example, a technique of storing a table for establishing a relationship between the frequency difference information and the frequency correction amount in a memory in advance and referencing this table may be employed.

In the embodiments described above, the frequency difference between the first and second crystal units 10 and 20 is used as a so-called temperature measurement value, and the frequency correction value against the temperature fluctuation in the first crystal unit 10 is obtained based on this temperature measurement value. However, the scope of the invention set forth in claims may also include a case where the crystal unit serving as a frequency correction target and one of the crystal units serving as a thermometer are not commonly used.

In this case, the first correction value acquisition unit obtains a first correction value based on a first approximation formula expressing a relationship between a value corresponding to the difference value detected by the frequency difference detection unit, a value corresponding to the difference value, and a frequency correction value of an oscillation frequency f0 caused by a fact that an ambient temperature of another oscillation circuit for oscillating another crystal unit different from the first and second crystal units is different from the reference temperature, instead of obtaining the first correction value based on the first approximation formula expressing a relationship between the value corresponding to the difference value detected by the frequency difference detection unit, the value corresponding to the difference value, and the frequency correction value of the oscillation frequency f1 of the first oscillation circuit caused by a fact that an ambient temperature is different from the reference temperature, the second correction value acquisition unit obtains a second correction value based on a second approximation formula expressing a relationship between a value corresponding to the difference value, a group of values corresponding to the difference values arranged with a predetermined interval, and correction residual errors obtained in advance for each of values corresponding to the difference values belonging to the group, where the correction residual error refers to a difference between the first correction value defined in the first approximation formula and a frequency correction value actually measured in advance for the another crystal unit, instead of obtaining the second correction value based on the second approximation formula expressing a relationship between the value corresponding to the difference value, a group of values corresponding to the difference values arranged with a predetermined interval, and correction residual errors obtained in advance for each of values corresponding to the detection values belonging to the group, and the output of the oscillator device is generated by using an output of the another oscillation circuit instead of using the output of the first oscillation circuit.

What is claimed is:

1. An oscillator device for correcting a setting signal for setting an output frequency based on a detection result of an ambient temperature, comprising:
   a first crystal unit having a crystal element and a first electrode;
   a second crystal unit having a crystal element and a second electrode;
   first and second oscillation circuits connected to the first and second crystal units, respectively;
   a frequency difference detection unit that obtains a value corresponding to a difference value between a value corresponding to a difference between f1 and f1r and a value corresponding to a difference between f2 and f2r, where f1 denotes an oscillation frequency of the first oscillation circuit, f1r denotes an oscillation frequency of the first oscillation circuit at a reference temperature, f2 denotes an oscillation frequency of the second oscillation circuit, and f1r denotes an oscillation frequency of the second oscillation circuit at a reference temperature;

a first correction value acquisition unit that obtains a first correction value based on a first approximation formula expressing a relationship between a value corresponding to the difference value detected by the frequency difference detection unit, a value corresponding to the difference value, and a frequency correction value of the oscillation frequency f1 of the first oscillation circuit caused by a fact that an ambient temperature is different from the reference temperature;

a second correction value acquisition unit that obtains a second correction value based on a second approximation formula expressing a relationship between the value corresponding to the difference value, a group of values corresponding to the difference values arranged with a predetermined interval, and correction residual errors obtained in advance for each of the values corresponding to the detection values belonging to the group, where the correction residual error refers to a difference between the first correction value defined in the first approximation formula and the frequency correction value actually measured in advance; and a first adder unit that obtains the frequency correction value by adding the first and second correction values, wherein an output of the oscillator device is generated by using an output of the first oscillation circuit, and the setting signal is corrected based on the frequency correction value obtained by the first adder unit.

2. The oscillator device according to claim 1, wherein the first approximation formula is a polynomial approximation based on a least-square method for expressing a relationship between the value corresponding to the difference value and the frequency correction value actually measured.

3. The oscillator device according to claim 1, wherein the second approximation formula is a linear interpolation for interpolating correction residual errors obtained for values corresponding to the neighboring difference values belonging to the group.

4. The oscillator device according to claim 1, wherein the first and second correction value acquisition units use $\{(f2-f2r)/f2r\}-\{(f1-f1r)/f1r\}$ as a value corresponding to the difference value between a value corresponding to the difference between f1 and f1r and a value corresponding to the difference between f2 and f2r.

5. The oscillator device according to claim 1, wherein the frequency difference detection unit includes:

a pulse creating unit that creates a pulse of the difference frequency between f1 and f2;

a direct digital synthesizer (DDS) circuit unit that outputs a frequency signal having a signal value repeatedly rising and falling with time at a frequency depending on an input DC voltage;

a latch circuit that latches the frequency signal output from the DDS circuit unit on the pulse created by the pulse creating unit;

a loop filter that integrates the signal value latched by the latch circuit and outputs an integral value as the value corresponding to the difference value; and a second adder unit that obtains a difference between an output of the loop filter and a value corresponding to a difference between f1r and f2r and uses the obtained difference as an input value to the DDS circuit unit.

6. The oscillator device according to claim 1, wherein the crystal element of the first crystal unit and the crystal element of the second crystal unit are commonly used.

7. The oscillator device according to claim 1, wherein the first correction value acquisition unit obtains a first correction value based on a first approximation formula expressing a relationship between a value corresponding to the difference value detected by the frequency difference detection unit, a value corresponding to the difference value, and a frequency correction value of an oscillation frequency f0 caused by a fact that an ambient temperature of another oscillation circuit for oscillating another crystal unit different from the first and second crystal units is different from the reference temperature, instead of obtaining the first correction value based on the first approximation formula expressing a relationship between the value corresponding to the difference value detected by the frequency difference detection unit, the value corresponding to the difference value, and the frequency correction value of the oscillation frequency f1 of the first oscillation circuit caused by a fact that an ambient temperature is different from the reference temperature, the second correction value acquisition unit obtains a second correction value based on a second approximation formula expressing a relationship between a value corresponding to the difference value, a group of values corresponding to the difference values arranged with a predetermined interval, and correction residual errors obtained in advance for each of values corresponding to the difference values belonging to the group, where the correction residual error refers to a difference between the first correction value defined in the first approximation formula and a frequency correction value actually measured in advance for the another crystal unit, instead of obtaining the second correction value based on the second approximation formula expressing a relationship between the value corresponding to the difference value, a group of values corresponding to the difference values arranged with a predetermined interval, and correction residual errors obtained in advance for each of values corresponding to the detection values belonging to the group, and the output of the oscillator device is generated by using an output of the another oscillation circuit instead of using the output of the first oscillation circuit.

\* \* \* \* \*

UNITED STATES PATENT AND TRADEMARK OFFICE
CERTIFICATE OF CORRECTION

PATENT NO.        : 8,659,364 B2                                    Page 1 of 1
APPLICATION NO.   : 13/663482
DATED             : February 25, 2014
INVENTOR(S)       : Kaoru Kobayashi It is certified that error appears in the above-identified patent and that said Letters Patent is hereby corrected as shown below:

In the Claims

Column 18, line 66: In Claim 1, delete "f1r" an insert --f2r--.

Signed and Sealed this
First Day of July, 2014

Michelle K. Lee
*Deputy Director of the United States Patent and Trademark Office*